US009048102B2

(12) United States Patent
Gunjishima et al.

(10) Patent No.: US 9,048,102 B2
(45) Date of Patent: Jun. 2, 2015

(54) SIC SINGLE CRYSTAL, SIC WAFER, AND SEMICONDUCTOR DEVICE

(71) Applicants: KABUSHIKI KAISHA TOYOTA CHUO KENKYUSHO, Nagakute-shi, Aichi-ken (JP); DENSO CORPORATION, Kariya-shi, Aichi-ken (JP); TOYOTA JIDOSHA KABUSHIKI KAISHA, Toyota-shi, Aichi-ken (JP)

(72) Inventors: Itaru Gunjishima, Nagakute (JP); Yasushi Urakami, Toyoake (JP); Ayumu Adachi, Toyota (JP)

(73) Assignees: KABUSHIKI KAISHA TOYOTA CHUO KENKYUSHO, Nagakute-shi (JP); DENSO CORPORATION, Kariya (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/353,710

(22) PCT Filed: Dec. 3, 2012

(86) PCT No.: PCT/JP2012/081250
§ 371 (c)(1),
(2) Date: Apr. 23, 2014

(87) PCT Pub. No.: WO2013/081164
PCT Pub. Date: Jun. 6, 2013

(65) Prior Publication Data

US 2014/0291700 A1 Oct. 2, 2014

(30) Foreign Application Priority Data

Dec. 2, 2011 (JP) ................................ 2011-265342

(51) Int. Cl.
*H01L 29/04* (2006.01)
(Continued)

(52) U.S. Cl.
CPC .............. *H01L 29/045* (2013.01); *C30B 29/36* (2013.01); *C30B 23/025* (2013.01); *H01L 29/1608* (2013.01)

(58) Field of Classification Search
CPC ............ H01L 21/045; H01L 21/02667; H01L 21/02378; H01L 21/02447; H01L 21/02443; H01L 21/02529; H01L 27/1203; H01L 29/1608; C30B 25/16; C30B 29/30
USPC ........... 257/77, 628, 49, 50, 51, 78, 347, 352, 257/E21.006, E21.054, E21.129, E21.267, 257/E21.277, E21.32, E21.499
See application file for complete search history.

(56) References Cited

U.S. PATENT DOCUMENTS 7,135,074 B2 * 11/2006 Gunjishima et al. .......... 117/101
(Continued)

FOREIGN PATENT DOCUMENTS

JP A-2003-119097 4/2003
(Continued)

OTHER PUBLICATIONS

Fujiwara et al., "Reverse Electrical Characteristics of 4H-SiC JBS Diodes Fabricated on Substrate with Low Threading Dislocation Density," *Materials Science Forum*, 2011, vols. 679-680, pp. 694-697.
(Continued)

*Primary Examiner* — David Nhu
(74) *Attorney, Agent, or Firm* — Oliff PLC

(57) ABSTRACT

An SiC single crystal includes a low dislocation density region (A) where the density of dislocations each of which has a Burgers vector in a {0001} in-plane direction (mainly a direction parallel to a <11-20> direction) is not more than 3,700 $cm/cm^3$. Such an SiC single crystal is obtained by: cutting out a c-plane growth seed crystal of a high offset angle from an a-plane grown crystal; applying c-plane growth so that the density of screw dislocations introduced into a c-plane facet may fall in a prescribed range; cutting out a c-plane growth crystal of a low offset angle from the obtained c-plane grown crystal; and applying c-plane growth so that the density of screw dislocations introduced into a c-plane facet may fall in a prescribed range. An SiC wafer and a semiconductor device are obtained from such an SiC single crystal.

17 Claims, 18 Drawing Sheets

(51) Int. Cl.

| | |
|---|---|
| ***H01L 31/036*** | (2006.01) |
| ***C30B 29/36*** | (2006.01) |
| ***C30B 23/02*** | (2006.01) |
| ***H01L 29/16*** | (2006.01) |

(56) References Cited

U.S. PATENT DOCUMENTS

| | | | | |
|---|---|---|---|---|
| 8,384,090 B2 * | 2/2013 | Powell et al. | ................... | 257/77 |
| 8,785,946 B2 * | 7/2014 | Powell et al. | ................... | 257/77 |
| 2005/0211156 A1 | 9/2005 | Gunjishima et al. | | |

FOREIGN PATENT DOCUMENTS

| | | |
|---|---|---|
| JP | A-2003-523918 | 8/2003 |
| JP | A-2004-323348 | 11/2004 |
| JP | A-2008-115035 | 5/2008 |
| JP | A-2008-515748 | 5/2008 |
| JP | A-2008-542181 | 11/2008 |
| JP | A-2008-290938 | 12/2008 |
| JP | A-2010-89983 | 4/2010 |
| WO | WO 01/63020 A1 | 8/2001 |
| WO | WO 2006/041659 A2 | 4/2006 |
| WO | WO 2006/135476 A1 | 12/2006 |

OTHER PUBLICATIONS

Kallinger et al., "Dislocation Conversion and Propagation during Homoepitaxial Growth of 4H-SiC," *Materials Science Forum*, 2010, vols. 645-648, pp. 299-302.

Nakamura et al., "Topographic study of dislocation structure in hexagonal SiC single crystals with low dislocation density," *Journal of Crystal Growth*, 2007, vol. 304, pp. 57-63.

Dudley et al., "Sychrotron X-ray Topography Studies of the Propagation, and Post-Growth Mutual Interaction of Threading Growth Dislocations with c-component of Burgers Vector in PVT-Growth 4H-SiC," *International Conference on Silicon Carbide and Related Materials Abstract Book*, 2011, p. 178.

Wang et al., "X-Ray Topographic Studies of Defects in PVT 6H-SiC Substrates and Epitaxial 6H-SiC Thin Films," *Mat. Res. Soc. Symp. Proc.*, 1994, vol. 339, pp. 735-740.

International Search Report issued in International Patent Application No. PCT/JP2012/081250 mailed Jan. 15, 2013.

International Preliminary Report on Patentability issued in International Patent Application No. PCT/JP2012/081250 mailed Mar. 31, 2014 (with translation).

* cited by examiner (1-100) plane diffraction topography image (01-10) plane diffraction topography image (A)

(B)

SIC SINGLE CRYSTAL, SIC WAFER, AND SEMICONDUCTOR DEVICE

FIELD OF THE INVENTION

This application is a national stage application of international application PCT/JP2012/081250 filed on Dec. 3, 2012, which claims priority to Japanese Patent Application JP-2011-265342 filed on Dec. 2, 2011 The present invention relates to an SiC single crystal, an SiC wafer, and a semiconductor device; more specifically to an SiC single crystal having a lower dislocation density than ever before, and an SiC wafer and a semiconductor device manufactured from such an SiC single crystal.

BACKGROUND OF THE INVENTION

In SiC (silicon carbide), a high-temperature type (α-type) having a hexagonal crystal structure and a low-temperature type (β-type) having a cubic crystal structure are known. SiC is characterized, in comparison with Si, by having high thermal resistance, a broad band gap, and a high dielectric breakdown field strength. For that reason, a semiconductor including an SiC single crystal is expected as a candidate material of a next-generation power device substituting for an Si semiconductor. In particular, α-type SiC has a band gap broader than β-type SiC and hence the α-type SiC attracts attention as a semiconductor material of an ultralow power-loss power device.

α-type SiC has, as the principal crystal plane, a {0001} plane (hereunder referred to also as "c-plane"), and a {1-100} plane and a {11-20} plane (hereunder referred to also as "a-plane" collectively) perpendicular to the {0001} plane.

A c-plane growth method and an a-plane growth method have heretofore been known as methods of obtaining an α-type SiC single crystal. The "c-plane growth method" cited here means a method of: using as a seed crystal an SiC single crystal in which a c-plane or a plane having an offset angle to the c-plane in a prescribed range is exposed as a growth plane; and growing an SiC single crystal over the growth plane by a sublimation reprecipitation method or the like. Meanwhile, the "a-plane growth method" means a method of: using as a seed crystal an SiC single crystal in which an a-plane or a plane having an offset angle to the a-plane in a prescribed range is exposed as a growth plane; and growing an SiC single crystal over the growth plane.

In order to materialize a high-performance SiC power device, reducing a leak current and inhibiting withstand voltage from deteriorating in an SiC device are indispensable requirements (Non-patent Literature 1), and it is necessary to reduce a dislocation density in an SiC single crystal that causes the drawbacks.

As dislocations existing in an SiC single crystal, there are a micropipe, a threading screw dislocation, a basal plane dislocation, and a threading edge dislocation. Among them, a micropipe is now being eradicated by the progress of technologies for improving the quality of an SiC single crystal and hence a threading screw dislocation, a basal plane dislocation, and a threading edge dislocation are going to be the next targets of the improvement. Among those three types of dislocations, each of the most of the basal plane dislocations and the threading edge dislocations has a Burgers vector (vector representing the orientation of the inconsistency of atoms around a dislocation line) in a {0001} in-plane direction. Consequently, such dislocations are dislocations capable of changing the orientations and convertible to each other in a crystal while the way of the distortion of crystal lattices is maintained. As a result in general, only by reducing either the basal plane dislocations or the threading edge dislocations, the reduction of one type dislocations causes the other type dislocations to increase.

This is backed by Patent Literature 1, too. The literature describes that, when a single crystal grows on a wafer having a basal plane dislocation density of 10,000 pieces/$cm^2$ and an edge dislocation density of 10,000 pieces/$cm^2$, the basal plane dislocation density comes to be 500 pieces/$cm^2$ and the edge dislocation density comes to be 19,500 pieces/$cm^2$ and thus the edge dislocations increase in exchange of the reduction of the basal plane dislocations. Consequently, it is difficult to manufacture a high-performance SiC device by using such a crystal.

The crystal described in the literature is obtained not by a gas phase method used in the present invention but by a solvent epitaxy method (liquid phase method). Meanwhile, it is known that a dislocation line changes the orientation while a Burgers vector is conserved (Burgers vector conservation law). By the Burgers vector conservation law, the principle that an edge dislocation density increases in exchange of the reduction of a basal plane dislocation density does not change regardless of a manufacturing method such as a gas phase method or a liquid phase method.

Although it is frequently attempted recently to convert basal plane dislocations to threading edge dislocations during epitaxial growth in particular in order to inhibit the forward direction degradation of a bipolar device (Non-patent Literature 2), an increase in the threading edge dislocations as stated above eventually causes leak current to increase (Non-patent Literature 1).

The present inventors: have cut out a crystal obtained by a method of carrying out a c-plane growth after a-plane growth is repeated, a so-called repeated a-face (a-plane) growth (RAF) method (Patent Literature 2), along a c-plane and a plane vertical to the c-plane; and have analyzed a three-dimensional structure of dislocations from X-ray topography images thereof (Non-patent Literature 3). The major reason why a dislocation structure has been able to be analyzed is that a dislocation density has reduced in a crystal by the RAF method and a clearer dislocation image has been obtained in comparison with conventional SiC. In an SiC single crystal for a power device however, the densities of the basal plane dislocations and the threading edge dislocations have been still high.

CITATION LIST

Patent Literature

[Patent Literature 1]
Japanese Unexamined Patent Application Publication No. 2010-089983
[Patent Literature 2]
Japanese Unexamined Patent Application Publication No. 2003-119097

Non-Patent Literature

[Non-Patent Literature 1]
H. Fujiwara et al., Mater. Sci. Forum Vol. 679-680 (2011), pp. 694-697
[Non-Patent Literature 2]
B. Kallinger et al., Mater. Sci. Forum Vol. 645-648 (2010), pp. 299-302

[Non-Patent Literature 3]

D. Nakamura et al., Journal of Crystal Growth 304 (2007) 57-63

[Non-Patent Literature 4]

M. Dadley et al., 2011 International Conference on Silicon Carbide and Related Materials Abstract Book p. 178

[Non-Patent Literature 5]

S. Wang et al., Mater. Res. Soc. Proc. 339 (1994) 735

SUMMARY OF THE INVENTION

A problem to be solved by the present invention is to provide: an SiC single crystal having a low density of dislocations (mainly basal plane dislocations and threading edge dislocations) each of which has a Burgers vector in a {0001} in-plane direction (mainly a direction parallel to a <11-20> direction) and mixed dislocations (refer to Non-patent Literature 4) in which Burgers vectors in a direction parallel to a <0001> direction are mixed with them; and an SiC wafer and a semiconductor device manufactured from such an SiC single crystal.

In order to solve the problem, an SiC single crystal according to the present invention is characterized by including a low dislocation density region (A) where the density of dislocations each of which has a Burgers vector in a {0001} in-plane direction is not more than 3,700 $cm/cm^3$. Here, the reason why a dislocation density is represented by a dislocation line length per unit volume is that, in the case of basal plane dislocations, whereas a surface density is an index that depends on an offset angle of a substrate, a volume density is an index that does not depend on an offset angle of a substrate.

An SiC single crystal may further include a low dislocation density region (B) where the density of dislocations each of which has a Burgers vector in a direction parallel to a <0001> direction is not more than 740 $cm/cm^3$.

An SiC wafer according to the present invention is characterized by being cut out from an SiC single crystal according to the present invention and having the low dislocation density region (A) accounting for not less than 50% of the wafer surface area.

Further, a semiconductor device according to the present invention is manufactured by using an SiC wafer according to the present invention.

A c-plane growth substrate having a large offset angle is cut out from an SiC single crystal formed by repeating a-plane growth and a screw dislocation generating region is formed on the upstream side in the offset direction. When a c-plane growth is carried by using it as a seed crystal, the growth of the single crystal progresses while the dislocations included in the seed crystal and the dislocations leaking out from the screw dislocation generating region are discharged to the downstream side in the offset direction without converting the direction to the growth direction.

Successively, a c-plane growth substrate having a small offset angle is cut out from the obtained c-plane grown crystal and a screw dislocation generating region is formed on the upstream side in the offset direction. When a c-plane growth is carried out again by using it as a seed crystal, the growth of the single crystal progresses while the dislocations are inhibited from leaking out from the seed crystal and the screw dislocation generating region.

On this occasion, when a screw dislocation generating region is formed on the surface of the seed crystal so that a screw dislocation density introduced into a c-plane facet existing on the upstream side in the offset direction may fall in a given range, the densities of basal plane dislocations and threading edge dislocations reduce significantly in comparison with a conventional method. An epitaxial layer having small amount of impurities is formed in the event of manufacturing a power device on an SiC single crystal substrate. In a 4°-offset substrate generally used, almost 100% of the basal plane dislocations are converted into threading edge dislocations. When epitaxial growth is carried out by using an SiC single crystal according to the present invention having a low combined density of the basal plane dislocations and the threading edge dislocations, the density of threading dislocations in an epitaxial layer comes to be extremely low and a high-performance SiC device can be manufactured.

BRIEF DESCRIPTION OF THE DRAWINGS

FIGS. 15(*a*2), 15(*b*2), and 15(*c*2) are images of 10-mm square regions extracted and expanded respectively from positions corresponding to FIGS. 15(*a*1), 15(*b*1), and 15(*c*1) of a (11-20) plane diffraction X-ray topography image of a wafer B cut out from an SiC single crystal;

DETAILED DESCRIPTION OF THE PREFERRED EMBODIMENTS

An embodiment according to the present invention is explained hereunder in detail.

[1. Definition of Terms]

"A dislocation having a Burgers vector in a {0001} in-plane direction" means an edge dislocation, a screw dislocation, or a mixed dislocation having a Burgers vector oriented mainly in a {0001} in-plane direction. A Burgers vector of a dislocation existing in SiC is parallel or vertical to a {0001} plane ideally but a dislocation may sometimes has both the components of the two kinds of Burgers vectors because of a distortion of a crystal or the like (refer to Non-patent Literature 4). "A dislocation having a Burgers vector in a {0001} in-plane direction" includes not only a dislocation having a Burgers vector completely parallel to a {0001} plane but also a dislocation having a Burgers vector in a direction deviated from a direction parallel to a {0001} plane because of a distortion of a crystal or the like. This shall apply to other dislocations that will be explained hereunder.

Further, "a dislocation having a Burgers vector in a {0001} in-plane direction" includes not only a dislocation having a Burgers vector in a direction parallel to a <11-20> direction but also a dislocation having a Burgers vector in a direction parallel to another direction. It is estimated however that "a dislocations having a Burgers vector in a {0001} in-plane direction" is mostly a dislocation having a Burgers vector in a direction parallel to a <11-20> direction.

Figure 2:
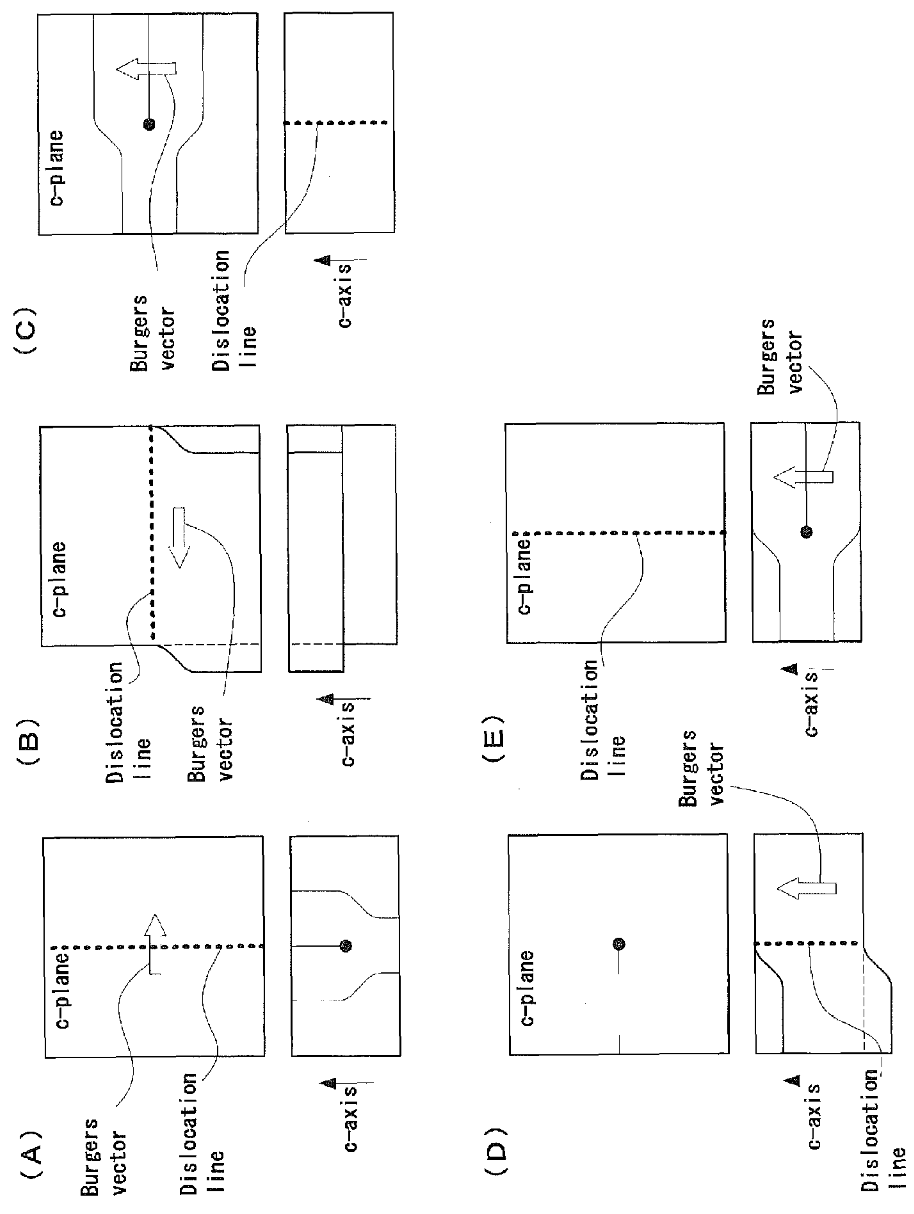
FIGS. 2A to 2E are schematic illustrations explaining various types of dislocations.

"A dislocation having a Burgers vector in a direction parallel to a <11-20> direction" means (A) a basal plane dislocation having a Burgers vector in a direction parallel to a <11-20> direction (hereunder referred to merely as "a basal plane dislocation") (refer to FIGS. 2A and 2B), or (B) an edge dislocation having a dislocation line nearly vertical to a {0001} plane (basal plane) and having a Burgers vector in a direction parallel to a <11-20> direction (a threading edge dislocation) (refer to FIG. 2C).

Further, "a dislocation having a Burgers vector in a direction parallel to a <11-20> direction" includes not only a dislocation having a Burgers vector in a direction completely parallel to a <11-20> direction but also a direction having both a Burgers vector component in a <11-20> direction and a Burgers vector component in a <0001> direction because of a distortion of a crystal or the like.

"A basal plane dislocation having a Burgers vector in a direction parallel to a <11-20> direction" means (a) an edge dislocation having a dislocation line on a {0001} plane (basal plane) and having a Burgers vector in a direction parallel to a <11-20> direction (refer to FIG. 2A), (b) a screw dislocation having a dislocation line on a {0001} plane (basal plane) and having a Burgers vector in a direction parallel to a <11-20> direction (refer to FIG. 2B), or (c) a mixed dislocation of (a) and (b).

"A dislocation having a Burgers vector in a direction parallel to a <0001> direction" means (A) a screw dislocation (threading screw dislocation) having a dislocation line nearly vertical to a {0001} plane (basal plane) and having a Burgers vector in a direction parallel to a <0001> direction (refer to FIG. 2D) or (B) an edge dislocation having a dislocation line on a {0001} plane (basal plane) and having a Burgers vector in a direction parallel to a <0001> direction (a basal plane edge dislocation having a Burgers vector in a direction parallel to a <0001> direction) (refer to FIG. 2E).

[2. SiC Single Crystal]

[2.1. Dislocation Having a Burgers Vector in a {0001} In-Plane Direction]

An SiC single crystal according to the present invention is characterized by including a low dislocation density region (A) where a volume density of dislocations each of which has a Burgers vector in a {0001} in-plane direction is not more than 3,700 $cm/cm^3$.

"A low dislocation density region (A)" means a region at least satisfying the condition that "a volume density of the dislocations each of which has a Burgers vector in a {0001} in-plane direction is not more than 3,700 $cm/cm^3$" in a measurement region where a volume density of dislocations each of which has a Burgers vector in a {0001} in-plane direction is measured.

Figure 4:
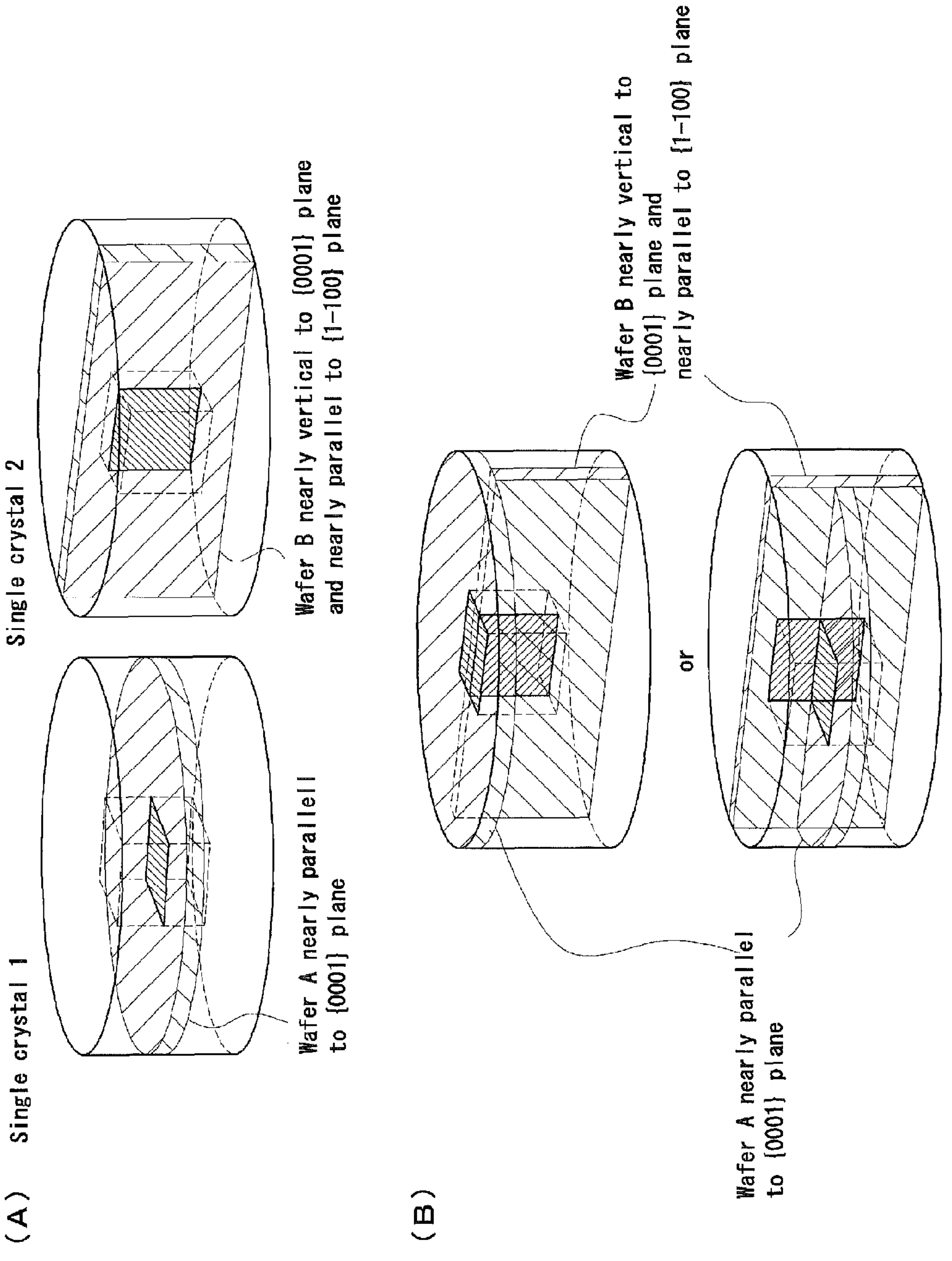
FIG. 4A is a schematic illustration explaining a method of taking out wafers A and B for X-ray topography measurement from two single crystals grown under the same conditions.
FIG. 4B is a schematic illustration explaining a method of taking out wafers A and B for X-ray topography measurement from one single crystal.

As it will be described later, two wafers A and B cut out in directions nearly perpendicular to each other are used when a low dislocation density region (A) is judged. A low dislocation density region (A) is a cubic region or a rectangular parallelepiped region where the planes perpendicular to each other include a plane of a measurement region on the wafer A (10 mm square or 10×t mm) and a plane of the measurement region on the wafer B (10 mm square or 10×t mm) respectively. In FIG. 4, the cubic region represented by the broken lines corresponds to the low dislocation density region (A).

When manufacturing conditions are optimized, a volume density of dislocations each of which has a Burgers vector in a {0001} in-plane direction is not more than 3,000 $cm/cm^3$, not more than 2,000 $cm/cm^3$, or not more than 1,000 $cm/cm^3$.

[2.2. Dislocation Having a Burgers Vector in a Direction Parallel to a <11-20> Direction]

An SiC single crystal according to the present invention preferably includes a low dislocation density region (A) where a volume density of dislocations each of which has a Burgers vector in a direction parallel to a <11-20> direction is not more than 3,700 $cm/cm^3$.

It is estimated that most of dislocations each of which has a Burgers vector in a {0001} in-plane direction include dislocations each of which has a Burgers vector in a direction parallel to a <11-20> direction. Consequently, an SiC single crystal having at least a volume density of dislocations each of which has a Burgers vector in a direction parallel to a <11-20> direction of not more than the above value comes to be a semiconductor of a low power loss.

Figure 1:
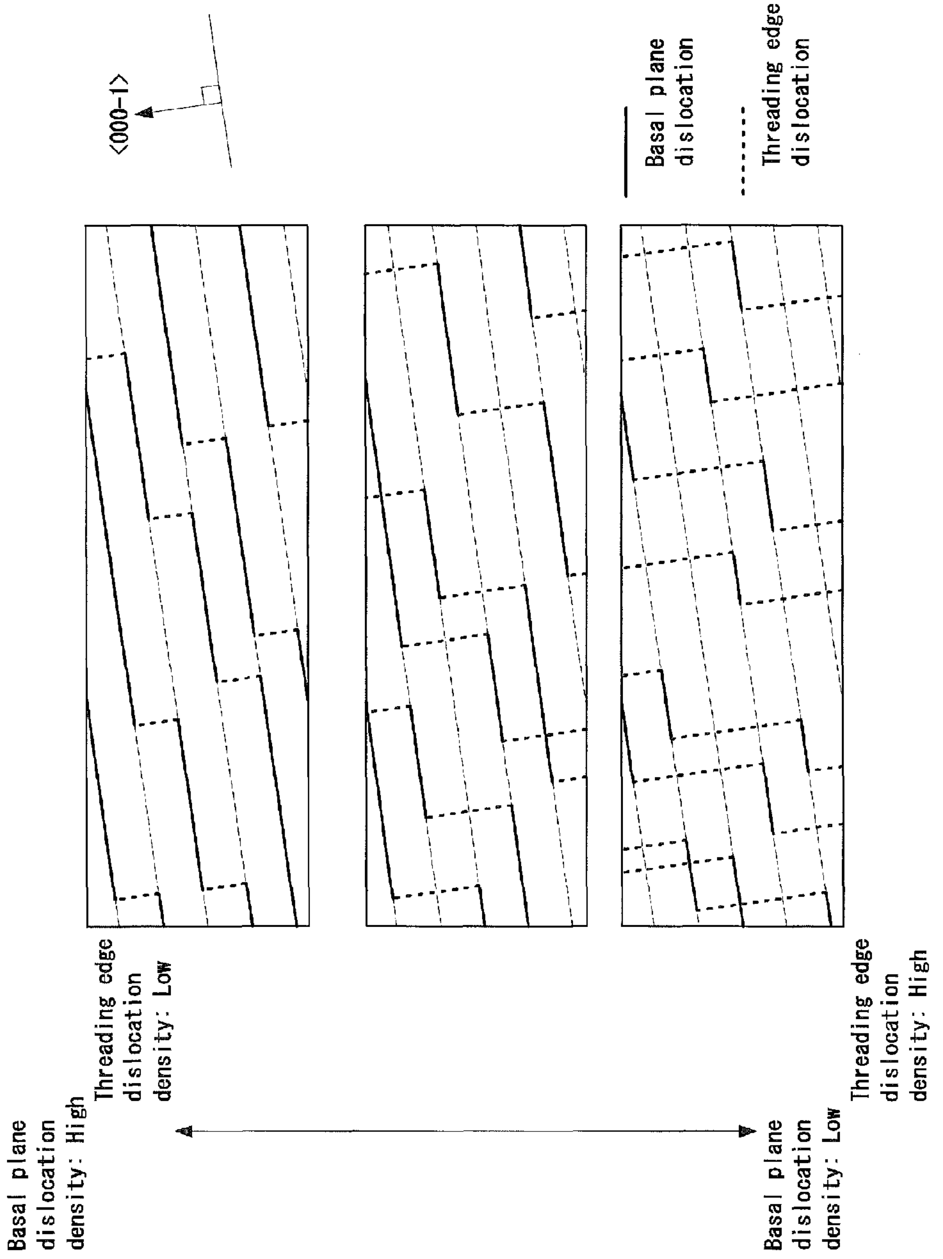
FIG. 1 is a schematic illustration showing the relationship between a basal plane dislocation density and a threading edge dislocation density.

Dislocations each of which has a Burgers vector in a direction parallel to a <11-20> direction are represented as the sum of basal plane dislocations and threading edge dislocations. A basal plane dislocation and a threading edge dislocation are dislocations convertible to each other. As shown in FIG. 1 therefore, in general the reduction of a basal plane dislocation density causes a threading edge dislocation density to increase in exchange.

In contrast, it is possible to reduce a basal plane dislocation density and a threading edge dislocation density simultaneously by using a method described below.

When manufacturing conditions are optimized, it is possible to obtain an SiC single crystal including a low dislocation density region (A) where (a) a volume density of dislocations each of which has a Burgers vector in a direction parallel to a <11-20> direction is not more than 3,700 cm/cm$^3$ and (b) a volume density of threading edge dislocations is not more than 1,200 cm/cm$^3$.

When the manufacturing conditions are further optimized, a volume density of dislocations each of which has a Burgers vector in a direction parallel to a <11-20> direction comes to be not more than 3,000 cm/cm$^3$, not more than 2,000 cm/cm$^3$, or not more than 1,000 cm/cm$^3$. In response to that, a volume density of threading edge dislocations comes to be not more than 970 cm/cm$^3$, not more than 650 cm/cm$^3$, or not more than 320 cm/cm$^3$, respectively.

Otherwise, when manufacturing conditions are optimized, it is possible to obtain an SiC single crystal including a low dislocation density region (A) where (a) a volume density of dislocations each of which has a Burgers vector in a direction parallel to a <11-20> direction is not more than 3,700 cm/cm$^3$ and (b) a volume density of basal plane dislocations each of which has a Burgers vector in a direction parallel to a <11-20> direction is not more than 2,500 cm/cm$^3$.

When the manufacturing conditions are further optimized, a volume density of dislocations each of which has a Burgers vector in a direction parallel to a <11-20> direction comes to be not more than 3,000 cm/cm$^3$, not more than 2,000 cm/cm$^3$, or not more than 1,000 cm/cm$^3$. In response to that, a volume density of basal plane dislocations comes to be not more than 2,000 cm/cm$^3$, not more than 1,400 cm/cm$^3$, or not more than 700 cm/cm$^3$, respectively.

Otherwise, when the manufacturing conditions are optimized, it is possible to obtain an SiC single crystal including a low dislocation density region (A) not including a stacking fault.

Here, "not including a stacking fault" means that an area ratio of planar fault images having different brightness to a wafer is 10% or less when three equivalent diffraction images are photographed in a {1-100} plane diffraction of transmission arrangement X-ray topography, which will be described later, on the wafer cut out nearly parallel to a {0001} plane. When the manufacturing conditions are further optimized, the area ratio of stacking faults comes to be not more than 5%, not more than 2%, not more than 1%, or 0%.

[2.3. Dislocation Having a Burgers Vector in a Direction Parallel to a <0001> Direction]

An SiC single crystal generally includes a dislocation having a Burgers vector in a direction parallel to a <0001> direction in addition to a dislocation having a Burgers vector in a [0001] in-plane direction (mostly a direction parallel to a <11-20> direction). The dislocations have no mutually convertible relationship but the dislocations are hardly discharged outside a crystal by interwinding with each other. As a result, a crystal having one type dislocations abundantly tends to have the other type dislocations abundantly (refer to Non-patent Literature 5).

By using a method described later, it is possible to obtain an SiC single crystal including a low dislocation density region (B) where a volume density of dislocations each of which has a Burgers vector in a direction parallel to a <0001> direction is not more than 740 cm/cm$^3$ in addition to a low dislocation density region (A).

When manufacturing conditions are optimized, a volume density of dislocations each of which has a Burgers vector in a direction parallel to a <0001> direction comes to be not more than 630 cm/cm$^3$, not more than 420 cm/cm$^3$, or not more than 210 cm/cm$^3$.

"A low dislocation density region (B)" means a region satisfying at least the condition that "a volume density of dislocations each of which has a Burgers vector in a direction parallel to a <0001> direction is not more than 740 cm/cm$^3$" in a measurement region where a volume density of dislocations each of which has a Burgers vector in a direction parallel to a <0001> direction is measured.

As will be described later, a wafer B is used when a low dislocation density region (B) is judged. A low dislocation density region (B) is a rectangular parallelepiped region defined by a measurement region on the wafer B (10 mm square or 10×t mm) and the thickness of the wafer B.

Dislocations each of which has a Burgers vector in a direction parallel to a <0001> direction are represented by the sum of threading screw dislocations and basal plane edge dislocations each of which has a Burgers vector in a direction parallel to a <0001> direction.

It is possible to simultaneously reduce the densities of threading screw dislocations and basal plane edge dislocations each of which has a Burgers vector in a direction parallel to a <0001> direction by using a method described below.

When manufacturing conditions are optimized, it is possible to obtain an SiC single crystal including a low dislocation density region (B) where (a) a volume density of dislocations each of which has a Burgers vector in a direction parallel to a <0001> direction is not more than 740 cm/cm$^3$ and (b) a volume density of threading screw dislocations is not more than 690 cm/cm$^3$.

When manufacturing conditions are further optimized, a volume density of dislocations each of which has a Burgers vector in a direction parallel to a <0001> direction comes to be not more than 630 cm/cm$^3$, not more than 420 cm/cm$^3$, or not more than 210 cm/cm$^3$. In response to that, a volume density of threading screw dislocations comes to be not more than 590 cm/cm$^3$, not more than 390 cm/cm$^3$, or not more than 200 cm/cm$^3$, respectively.

Otherwise, when manufacturing conditions are optimized, it is possible to obtain an SiC single crystal including a low dislocation density region (B) not including dislocations each of which has a Burgers vector in a direction parallel to a <0001> direction.

Here, "not including dislocations each of which has a Burgers vector in a direction parallel to a <0001> direction" means that a volume density of such dislocations is not more than 1 cm/cm$^3$.

[2.4. Low Dislocation Density Region (A)]

Whether or not an SiC single crystal has a low dislocation density region (A) can be judged by: applying X-ray topography (FIG. 3) of transmission arrangement, which is sensitive to an inner structure of a crystal, to a substrate nearly parallel to a c-plane (wafer A) and a substrate nearly parallel to a threading direction (direction vertical to a basal plane) (wafer B); and computing a dislocation density. Specifically, the judgment for the presence of a low dislocation density region (A) is carried out through the following procedures.

[2.4.1. Cutout of Specimen and X-Ray Topography Measurement]

The following wafers are taken out from an SiC single crystal and the following X-ray topography measurement based on transmission arrangement is applied to:

(a) a wafer A cut out nearly parallel to a {0001} plane: {1-100} plane diffraction (or {11-20} plane diffraction) and (b) a wafer B cut out nearly vertically to a {0001} plane and nearly parallel to a {1-100} plane (or (11-20) plane): {11-20} plane diffraction (or {1-100} plane diffraction).

When {1-100} plane diffraction is applied, it is preferable to apply the {1-100} plane diffraction to three crystallographically-equivalent planes.

Wafers A and B may be taken out from nearly identical regions of two single crystals 1 and 2 grown under identical conditions so that the volumes of the measurement regions may be nearly constant as shown in FIG. 4A.

Otherwise, wafers A and B may be taken out from regions close to each other of one single crystal so that the volumes of the measurement regions may be nearly constant as shown in FIG. 4B.

In either the case where the thicknesses of the wafers A and B are too thin or the case where the volumes of the measurement regions are too small, it sometimes happens that an average dislocation density may not be measured because of the measurement of a region where dislocations are locally few or a region where dislocations are locally many. On the other hand, when the wafers A and B are too thick, X-rays hardly penetrate.

Consequently, each of the wafers A and B is cut out so that (a) the thickness may be not less than 100 μm to not more than 1,000 μm and (b) the volume of the measurement region may be not less than 0.03 cm$^3$.

The thicknesses of the wafers A and B are preferably 300 to 700 μm and yet preferably 400 to 600 μm.

[2.4.2. Compartment of Measurement Region]

An obtained X-ray topography image is comparted into a square measurement region with a side length of 10±0.1 mm. Here, when a wafer of a thickness t mm (<10 mm) is formed already by slicing an SiC single crystal nearly parallel to a {0001} plane or nearly vertically to a {0001} plane and X-ray topography measurement is applied to a plane vertical to the wafer surface, the wafer is shredded in the thickness direction, X-ray topography measurement is applied to the shredded wafer, and the obtained X-ray topography image is comparted into a rectangular region of 10±0.1 mm×t mm. A wafer topography image may sometimes be largely distorted depending on arrangement in the X-ray topography measurement. On this occasion, the dimensional ratio of the X-ray topography image is modified so as to obtain an actual wafer shape.

When the size of the measurement region is 10±0.1 mm×t mm (t<10 mm), it is desirable to: obtain dislocation lengths in n (>10/t) measurement regions; obtain a total dislocation length by summing the dislocation lengths included in the n measurement regions; and compute a dislocation density from the total dislocation length.

On this occasion, it is also possible to: take out n (>10/t) wafers A from adjacent sites of an identical SiC single crystal; measure the dislocation lengths in the n measurement regions located at the sites corresponding to the wafers A respectively; sum the dislocation lengths; and thus obtain a total dislocation length.

Otherwise, it is also possible to: compart one wafer A cut out from an identical SiC single crystal into measurement regions of 10±0.1 mm×t mm; measure dislocation lengths in adjacent n (>10/t) measurement regions in the identical wafer respectively; sum the dislocation lengths; and thus obtain a total dislocation length.

The above can also apply to a wafer B but, in the case of a wafer B, it is also possible to use a method of computing from a reflection topography image that will be described later.

[2.4.3. Measurement of Dislocation Length and Computation of Dislocation Density]

A total length of dislocations each of which has a Burgers vector in a direction on a c-plane is measured in each of the measurement regions of wafers A and B.

Here, for obtaining the total length of dislocations, it is possible to measure the length of each dislocation or, when the number of dislocations is large, it is also possible to use image processing software. Those are limited, however, to the case where the overlapping of dislocations does not have an effect significantly.

[2.4.3.1. {1-100} Plane Diffraction Image (or {11-20} Plane Diffraction Image) of Wafer A]

Dislocations each of which has a Burgers vector in a {0001} in-plane direction (mainly a direction parallel to a <11-20> direction) are projected to a {1-100} plane diffraction image of a wafer A. Among the dislocations, a threading edge dislocation and a threading screw dislocation having both Burgers vectors in a <0001> direction and a {0001} in-plane direction may sometimes be projected, in addition to a basal plane dislocation. A threading dislocation such as a threading edge dislocation or a threading screw dislocation however is vertical to the surface of the wafer A and hence appears as a dot or a short line segment. In contrast, a basal plane dislocation is nearly parallel to the surface of the wafer A and hence nearly reflects the actual shape and dimension. As a result, most of the dislocations photographed in an X-ray photography image are basal plane dislocations. Further, when a stacking fault having a Burgers vector in a direction parallel to a <1-100> direction exists, it is detected as a plane of different brightness.

Figure 5:
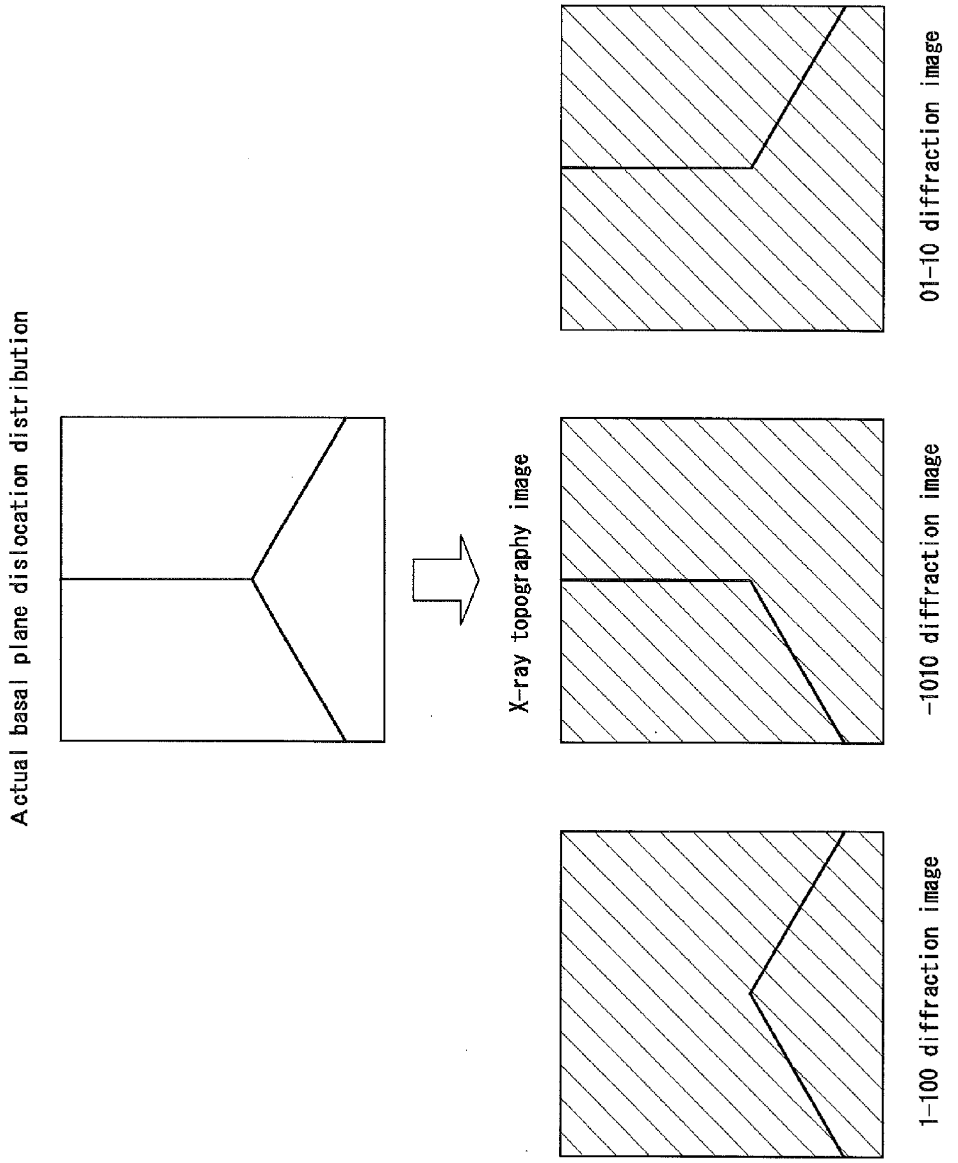
FIG. 5 is a view explaining the relationship between an actual distribution of basal plane dislocations and X-ray topography images.

Further, in a {1-100} plane diffraction image, a dislocation having a Burgers vector in a direction on a diffraction plane is not detected and hence basal plane dislocations that can be detected are about two thirds of actual dislocations (refer to FIG. 5). This is because many of basal plane dislocations each of which has a Burgers vector in a {0001} in-plane direction have Burgers vectors in directions parallel to a <11-20> direction in an SiC single crystal and one of the equivalent three <11-20> directions exists on a {1-100} plane.

For example, in {1-100} plane diffraction, basal plane dislocations having Burgers vectors mostly in a (−1010) in-plane direction (a direction parallel to a [1-210] direction) and in a (01-10) in-plane direction (a direction parallel to a [−2110] direction)) are detected. However, a basal plane dislocation having a Burgers vector mostly in a (1-100) in-plane direction (a direction parallel to a [11-20] direction) is not detected.

Consequently, it is possible to obtain a rough length of actual dislocations by multiplying the total length of the basal plane dislocations obtained from one diffraction image by 1.5. In order to measure the total length of the basal plane dislocations more accurately, it is only necessary to: sum the respective total lengths of the basal plane dislocations obtained from a (1-100) plane diffraction image, a (−1010) plane diffraction image, and a (01-10) plane diffraction image, those being crystallographically-equivalent three diffraction images; obtain an average total length of the dislocations by dividing the sum by 2; and compute a dislocation density by using it.

Here, it is also possible to use {11-20} plane diffraction for the measurement of a wafer A. On this occasion, all the basal plane dislocations are detected and hence it is unnecessary to multiply a measured dislocation length by 1.5 unlike {1-100} plane diffraction. According to experience by the present inventors, however, the contrasts of two thirds of basal plane dislocations are low and tend to be hardly visible to some extent. Further, a stacking fault cannot be detected by {11-20} plane diffraction. For that reason, {1-100} plane diffraction is preferably used for the measurement of a wafer A.

A density (a length per $cm^3$) is obtained by multiplying a total length of basal plane dislocations in a wafer of 1 $cm^2$ measured by the above method by 10 mm/wafer thickness (mm).

[2.4.3.2. {11-20} Plane Diffraction Image (or {1-100} Plane Diffraction Image) of Wafer B]

Dislocations each of which has a Burgers vector in a {0001} in-plane direction (mostly a direction parallel to a <11-20> direction) are projected to a {11-20} plane diffraction image (or {1-100} plane diffraction image) of a wafer B. Threading edge dislocations and basal plane dislocations are included in them. The total length of only the threading edge dislocations traversing a {0001} plane is obtained among them and is converted into a density (a length per $cm^3$).

Here, a dislocation which appears along a {0001} plane is a basal plane dislocation. Most of them are not parallel to the surface of a wafer B, however, do not reflect the actual shapes and dimensions, and hence are inaccurate.

Further, it is also possible to use {1-100} plane diffraction for the measurement of a wafer B. On this occasion, it is only necessary to multiply a dislocation length measured as stated above by 1.5. According to experience by the present inventors, however, when {1-100} plane diffraction is used for the measurement of a wafer B in particular, a diffraction image of another plane may be photographed in the manner of overlapping on a {1-100} plane diffraction image in many cases and a topography image comes to be indistinct. For that reason, {11-20} plane diffraction is preferably used for the measurement of a wafer B.

[2.4.4. Judgment]

The lengths per $cm^3$ of basal plane dislocations and threading edge dislocations obtained in [2.4.3.] are integrated. When an integrated value is in the range of not more than 3,700 $cm/cm^3$, the measurement region is judged as a "low dislocation density region (A)".

[2.5. Low Dislocation Density Region (B)]

Whether or not an SiC single crystal has a low dislocation density region (B) can be judged through the same procedures as those of a low dislocation density region (A) except that a {000m} diffraction image of a wafer B is photographed. Here, "m" represents a repetition period of α-type SiC polytype. For example in the case of 4H—SiC, a {0004} plane diffraction image is photographed because of m=4. Further, in the case of 6H—SiC, a {0006} plane diffraction image is photographed because of m=6.

That is, dislocations each of which has a Burgers vector in a direction parallel to a <0001> direction are projected to a {000m} diffraction image of a wafer B. Threading screw dislocations and basal plane edge dislocations (edge dislocations each of which has a dislocation line on a basal plane and has a Burges vector in a direction parallel to a c-axis direction) are included in them.

Here, a dislocation having both the components of Burgers vector in a {0001} in-plane direction and a Burgers vector in a <0001> direction is photographed in both {1-100} plane diffraction (or {11-20} plane diffraction) and {000m} plane diffraction in a wafer B but that is included in dislocations each of which has a Burgers vector in a direction parallel to a {0001} in-plane direction and is not included in dislocations each of which has a Burgers vector in a direction parallel to a <0001> direction. Consequently, a dislocation detected in both the diffractions is excluded from the dislocations detected in a {000m} plane diffraction.

Among those, the total lengths of threading screw dislocations traversing a {0001} plane and basal plane edge dislocations are obtained and converted into densities (lengths per $cm^3$), respectively.

The lengths per $cm^3$ of the threading screw dislocations and the basal plane edge dislocations thus obtained are integrated. In the case where the integrated value is in a range of not more than 740 $cm/cm^3$, the measurement region is judged as a "low dislocation density region (B)".

[2.6. Orientation Region]

"An orientation region" means a region where basal plane dislocations have high linearity and are oriented to directions parallel to crystallographically-equivalent three <11-20> directions.

When a dislocation density is extremely high, dislocations interwind with each other and hence basal plane dislocations do not orient. As a dislocation density reduces, basal plane dislocations are likely to orient. When a dislocation density reduces further, the orientation intensity of basal plane dislocations reduces inversely. An SiC single crystal according to the present invention has an extremely lower dislocation density than before. When manufacturing conditions are optimized, an SiC single crystal not only having a low volume density of dislocations but also having a low dislocation density region (A) not including an orientation region is obtained.

Specifically, "an orientation region" means a region judged through the following procedures:

(a) a wafer nearly parallel to a {0001} plane is cut out from an SiC single crystal, (b) X-ray topography measurement by transmission arrangement is applied to the wafer and X-ray topography images corresponding to three crystallographically-equivalent {1-100} plane diffractions are photographed, (c) each of the three X-ray topography images is transformed into a digital image obtained by quantifying the brightness of each point in the image and each of the three digital images is comparted into a square measurement region where the length L of each side is 10±0.1 mm, (d) two-dimensional Fourier transformation treatment is applied to each of the three digital images in the three measurement regions corresponding to an identical region on the wafer and a power spectrum (spectrum of the amplitude A of a Fourier coefficient) is obtained, (e) each of the three power spectra is converted into a polar coordinate function and a function $A_{ave.}(\theta)$ of angle (orientation) dependency of an average amplitude A is obtained ($0° \leq \theta \leq 180°$), (f) an integrated value $A'_{ave.}(\theta)$ of the three $A_{ave.}(\theta)$'s is shown in a graph (x-axis: θ, y-axis: $A'_{ave.}(\theta)$ and the ratio of a peak value $A'_{ave.}(\theta_i)$ to a background $B.G.(\theta_i)$ ($=A'_{ave.}(\theta_i)/B.G.(\theta_i)$ ratio) is computed for each of three $\theta_i$'s (i=1 to 3) corresponding to the three <1-100> directions, and (g) when all of the three $A'_{ave.}(\theta_i)/B.G.(\theta_i)$ ratios are 1.1 or more, the region of the wafer corresponding to the three measurement regions is judged as an "orientation region".

[2.7. Orientation Intensity]

"An orientation intensity" means the average of three $A'_{ave.}(\theta_i)/B.G.(\theta_i)$ ratios (i=1 to 3) corresponding to crystallographically-equivalent three <1-100> directions in a reciprocal lattice space. As an orientation intensity B increases, a basal plane dislocation has a higher linearity and a higher orientation in the <11-20> direction in an actual space.

In the case of using a method described later, when manufacturing conditions are optimized, it is possible to obtain an SiC single crystal not only having a low volume density of dislocations but also having a low dislocation density region (A) not including an orientation region where the orientation intensity B is 1.2 or more.

[3. Measurement Method of Dislocation Length (1)]

A dislocation length is specifically measured through the following procedures.

[3.1. Processing of Specimen: Procedure (a)]

Firstly, a wafer A and a wafer B are cut out from an SiC single crystal.

In the present invention, the procedure is based on the premise that general processing is applied to a specimen in order to photograph a basal plane dislocation (a {0001} in-plane dislocation) or a threading dislocation by X-ray topography. Specifically, processing is applied under the following conditions.

That is, a wafer A having an offset angle of 10° or less is cut out by slicing an SiC single crystal nearly parallel to a {0001} plane. Further, a wafer B having an offset angle of 10° or less is cut out by slicing the SiC single crystal nearly vertically to a {0001} plane and nearly parallel to a {1-100} plane (or a {11-20} Plane). Wafers A and B having thicknesses suitable for X-ray topography measurement are produced by shaving and grinding and thus flattening the wafer surfaces and further removing damaged layers on the surfaces. CMT treatment is preferably used for removing a damaged layer.

If each of the wafers A and B is too thin, a measured region is localized in the thickness direction and resultantly an average dislocation structure in the crystal cannot be evaluated. If each of the wafers A and B is too thick in contrast, X-rays hardly penetrate. Further, dislocation lines overlap extremely and a precise dislocation density is hardly measured. Consequently, the thicknesses of the wafers A and B are preferably 100 to 1,000 μm, yet preferably 300 to 700 μm, and still yet preferably 400 to 600 μm.

[3.2. X-Ray Topography: Procedure (b)]

Successively, X-ray topography measurement by transmission arrangement is applied to the wafers A and B. When {1-100} plane diffraction is applied, X-ray topography images corresponding to crystallographically-equivalent three {1-100} plane diffractions are preferably photographed.

In the present invention, the procedure is based on the premise that the procedure is carried out under ordinary X-ray topography measurement conditions for detecting a basal plane dislocation image or a threading dislocation image. Specifically, the measurement is applied under the following conditions:

Arrangement: transmission arrangement (Lang method, refer to FIG. 3), and

Diffraction conditions and measurement plane:

when a density of dislocations each of which has a Burgers vector in a {0001} in-plane direction (mainly a direction parallel to a <11-20> direction) is measured, (a) {1-100} plane diffraction (or {11-20} plane diffraction) of the wafer A and (b) {11-20} plane diffraction (or {1-100} plane diffraction) of the wafer B are used.

When a density of dislocations each of which has a Burgers vector in a direction parallel to a <0001> direction is measured, {000m} plane diffraction of the wafer B is used.

Transmission arrangement topography (a Lang method) is a means to be able to: photograph a fault distribution of a whole wafer; and be used for the quality inspection of a wafer. In the Lang method, there are a method of using a large-scale synchrotron and a method of using a small-scale X-ray generator of a laboratory level, and the measurement described in the present invention can be carried out by either of the methods. As for the latter method, a general procedure is explained here.

Figure 3:
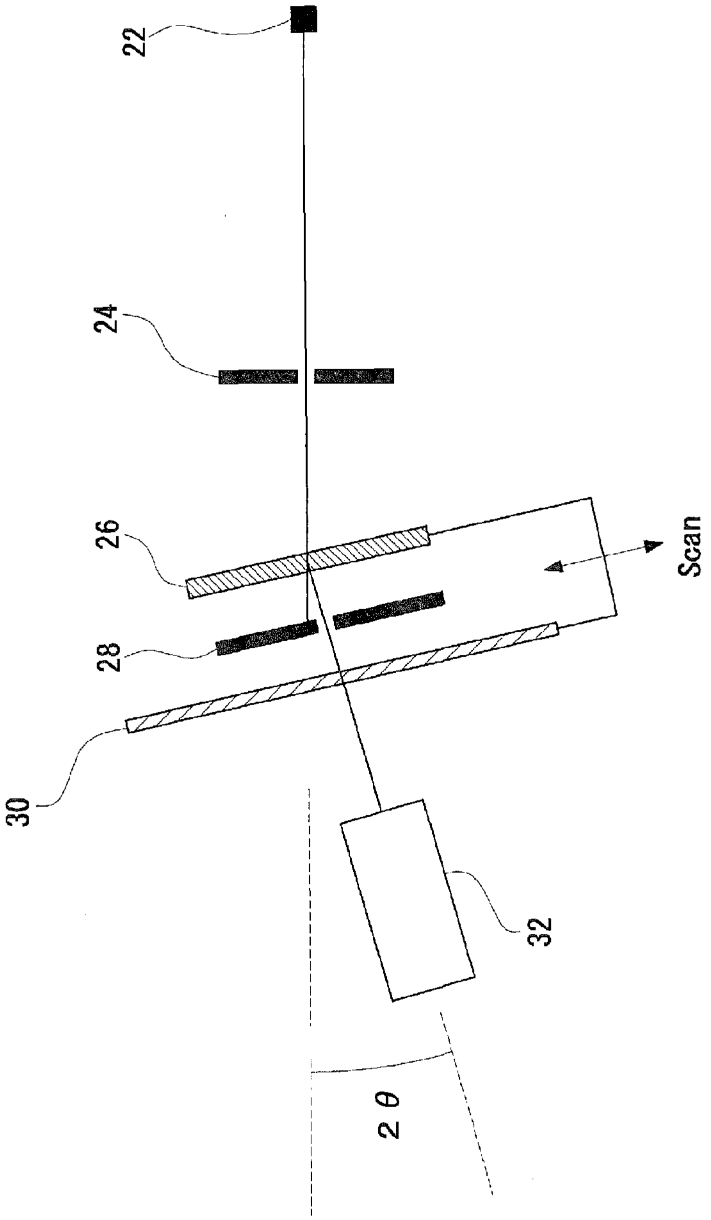
FIG. 3 is a schematic illustration of a Lang method (transmission arrangement topography)

As shown in FIG. 3, X-rays emitted from an X-ray source 22 are directed and narrowed with a first slit 24 and fed to a specimen 26. The incident X-rays irradiate a strip-shaped region of the specimen 26. When an orientation in a plane and an incidence angle are adjusted so as to satisfy diffraction conditions to a lattice plane of a crystal, diffraction occurs in the whole irradiated area.

An X-ray tube having Mo as the anode is used as the X-ray source 22 and the diffraction conditions are tailored to the wavelength of $K_{\alpha 1}$ in the $K_{\alpha}$ rays of characteristic X-rays. A second slit 28 has the functions of blocking primary X-rays coming through the specimen 26, appropriately narrowing the width so as to let only diffracted X-rays through, and reducing backgrounds caused by scattered X-rays. A film (or nuclear emulsion plate) 30 is arranged on the rear side of the second slit 28 and an X-ray detector 32 is arranged further on the rear side thereof.

With the arrangement, by scanning the specimen 26 in parallel to a specimen plane together with the film 30, a diffraction image ranging over the whole specimen 26 can be obtained.

A topograph thus obtained is called a traverse topograph. The topograph may sometimes be called a projection topograph because a three-dimensional fault image is projected two-dimensionally.

As a method for detecting a dislocation having a Burgers vector in a {0001} in-plane direction, generally {11-20} plane diffraction is also used. By the {11-20} plane diffraction however, a stacking fault in a {0001} plane cannot be detected.

Meanwhile, whereas dislocations having Burgers vectors of the three principal axes directions on a {0001} plane can be detected even in one measurement plane by the {11-20} plane diffraction, only dislocations having Burgers vectors of two principal axes directions in the three principal axes directions are detected in one measurement plane by {1-100} plane diffraction.

When dislocations are detected in a wafer A therefore, it is desirable to: use {1-100} plane diffraction capable of detecting also a stacking fault; and apply the measurement to three crystallographically-equivalent crystal planes having different angles.

[3.3. Digitization and Image Preprocessing of Topography Image: Procedure (c)]

Successively, each of the X-ray topography images is transformed into a digital image obtained by quantifying the brightness of each point in the image and each of the digital images is comparted into a measurement region having a size of 10±0.1 mm square or 10±0.1 mm×t mm.

In the present invention, the procedure is based on the premise that general processing for carrying out image analysis is applied. Specifically, digitization and image preprocessing are carried out under the following conditions.

(1) A topography image obtained on a film or a nuclear emulsion plate is digitized with a scanner or the like. The scanning conditions at the digitization are shown below:

Resolution: 512 pixels/cm or more in the actual size of a film, and

Mode: gray scale.

(2) A digitized topography image (digital image) is comparted into a square measurement region where the length L of each side is 10±0.1 mm or a rectangular measurement region of 10±0.1 mm×t mm. When the size of a wafer is relatively large, the wafer surface is comparted into squares and a plurality of measurement regions are taken out. In general, if a measurement region is too small, the measurement is localized and a result to an average structure of dislocations in a crystal is not obtained. In contrast, if a measurement region is too large, a basal plane dislocation image is too thin and obscure.

(4) The gray level of a digital image is adjusted so as to be able to obtain a clear dislocation image. Specifically, a dislocation site is adjusted to lightest (or darkest) and a non-dislocation site is adjusted to darkest (or lightest).

[3.4. Computation of Total Length of Dislocation Using Image Analysis Software: Procedure (d)]

For example, image analysis software capable of computing a ratio of pixels having set brightness or higher (or set brightness or lower) to total pixels in an image is used (for example, WinROOF V6.1 made by MITANI CORPORATION (http://mitani-visual.jp/download01.html, as of May, 2011). If software that can measure the total length of many line segments in an image is available, the software may be used.

Specifically, the total length of dislocations is computed through the following procedures.

(1) A reference region "a" having an arbitrary size (about 1 mm to 2 mm square, or a rectangular region having a size of about 1 to 4 $mm^2$ when the extraction of a square region is restricted by the size of a wafer) that allows the total length of dislocations to be directly measured comparatively easily is extracted from a measurement region where the length of each side is 10±0.1 mm or a measurement region of 10±0.1 mm×t mm in an X-ray topograph.

(2) A total length $L_a$ of dislocations in the reference region "a" is measured with a measure or directly with a personal computer.

(3) An area ratio $S_a$ of a dislocation section in the reference region "a" is measured by using image analysis software. When an area ratio of a dislocation section is measured, a threshold value of brightness is appropriately adjusted so as to be able to measure only the dislocation section to the greatest possible extent. When image analysis is applied in general, an image is processed by being converted into a bitmap format. A bitmap image is one of image formats in computer graphics and is obtained by dividing an image into pixels (many minute dots arrayed into a lattice shape) and expressing the colors and the concentrations of the dots as numerical values by using a color system such as RGB.

(4) A dislocation length $L_0$ per pixel is computed by: obtaining the number of pixels at the dislocation section in the reference region "a" from the product of the total pixel number $P_a$ (for example, investigated by using image analysis software (such as Photoshop)) of the image in the reference region "a" and the area ratio $S_a$ of the dislocation section; and dividing the total length $L_a$ of the dislocations in the reference region "a" by the product.

Dislocation length per pixel $L_0=L_a/P_a \cdot S_a$ (5) An area ratio $S_A$ of a dislocation section in a measurement region "A" is measured by using image analysis software. On this occasion, a threshold value set when the area ratio of the dislocation section in the reference region "a" is measured is used.

(6) A total dislocation length $L_A$ in the measurement region "A" can be computed by: obtaining the number of pixels of the dislocation section in the measurement region "A" from the product of a total pixel number $P_A$ in the measurement region "A" and the area ratio $S_A$ of the dislocation section; and multiplying it by the total length $L_0$ ($=L_a/P_a \cdot S_a$) per pixel.

[4. Measurement Method of Dislocation Length (2)]

In the case where an SiC single crystal is sliced nearly in a <0001> direction already and a measurement region is not secured enough or in the case where it is difficult to measure (for example, in the case where the thickness t (mm) of a wafer is less than 10 mm), when a density of threading dislocations extending in the direction nearly vertical to a wafer surface is measured, it is also possible to apply X-ray topography measurement by reflection arrangement (Berg-Barret method) to the wafer surface in place of applying X-ray topography measurement by transmission arrangement to a plane vertical to the wafer surface. A nearly identical result is obtained by either of the methods. Specifically, the X-ray topography measurement by reflection arrangement is applied through the following procedures.

Figure 6:
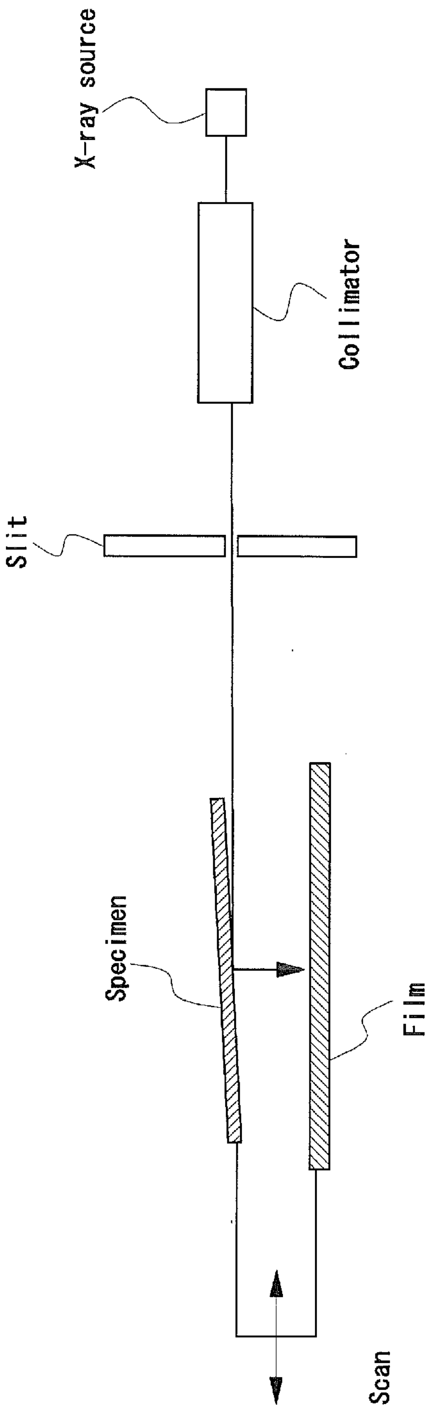
FIG. 6 is a view explaining a Berg-Barret method (surface-reflection topography).

As shown in FIG. 6, X-rays emitted from an X-ray source are fed to a specimen through a slit. The arrangement is facilitated by selecting, as the diffraction plane, a lattice plane which satisfies diffraction conditions with low angle incidence to a specimen surface and has a diffraction angle (2θ) of about 90°. Such reflection is called asymmetric reflection and, by using asymmetric reflection, it is possible to expand the width of a diffraction image to about ten times the width of the X-ray source and photograph a crystal surface of a wide area. By using asymmetric reflection, it is possible to reduce the distance between a specimen and a film and improve resolution. Further, it is possible to photograph the whole surface of a specimen by scanning like a Lang method. The Berg-Barret method can handle even a thick crystal which X-rays cannot penetrate and is not restricted by thickness. If a lattice distortion caused by a crystal defect or the like exists in a crystal, diffraction X-rays of a high intensity are generated at the part and the contrast of a defect image is obtained. By the effect, dislocations on a crystal surface yield an image. The contrast of a dislocation image is, however, weak in comparison with a Lang method of transmission arrangement.

The Berg-Barret method includes a method of using a large-scale synchrotron and a method of using a small-scale X-ray generator of a laboratory level, similarly to a Lang method. In the case of using a large-scale synchrotron, a reflection topography image is obtained by: taking out X-rays of an arbitrary wavelength suitable for asymmetric reflection from white X-rays generally with a monochromator of double crystal; and diffracting the X-rays on a specimen. In the case of using an X-ray generator of a laboratory level, an X-ray tube using Cu as the anode is used as the X-ray source and diffraction conditions are adjusted to the wavelength of $K_{\alpha 1}$ in $K_{\alpha}$ rays of characteristic X-rays. An X-ray beam emitted from a point-like X-ray source: passes through a crystal collimator (Si4 crystal monochromator/collimator); is restricted a wavelength region and a divergence angle; and thereafter is fed to a specimen through a first slit. Although the monochromaticity and parallelism of an X-ray beam are improved by passing through the crystal collimator, the intensity is extremely weak in comparison with the case of using a synchrotron and hence exposure of a long time is required. Exposure is carried out by placing an X-ray film or a dry plate on the reflection route of X-rays. On that occasion, a specimen and a film or a dry plate may be scanned or they may be fixed. Further, in the case of a crystal of high completeness, by displacing the incidence angle of X-rays slightly from a peak position and photographing at an off Bragg position, a large intensity variation can be expected in proportion to a trifle change of a lattice constant or a small inclination of a lattice plane and hence a picture of a good contrast can be taken.

When a threading dislocation extending in a direction nearly vertical to a {0001} plane is detected, a {11-28} plane diffraction is used as a diffraction condition of reflection X-ray topography. It is possible to detect all of both threading edge dislocations and threading screw dislocations by using the diffraction condition. In a reflection topography image, a threading edge dislocation is photographed as a relatively small white dot and a threading screw dislocation appears as a relatively large white dot (for example, refer to I. Kamata et al., Mater. Sci. Forum Vols. 645-648 (2010) pp 303-306). Since a threading edge dislocation extends in a direction nearly vertical to a specimen surface, a total length of threading edge dislocations (=surface dislocation density×t mm/10 (cm)) in a measurement area is obtained by measuring a surface density (number of dots per square centimeter) of relatively small white dots and multiplying it by the thickness of a specimen. By multiplying it by 10 mm/t mm (in other words, multiplying a surface dislocation density by 1 cm), a threading edge dislocation density per unit volume is obtained. A similar value is also obtained merely by changing the unit of a surface density.

[5. Judgment Method of Orientation Region]

"An orientation region" is judged through the following procedures.

[5.1. Processing of Specimen: Procedure (a)]

Firstly, a wafer nearly parallel to a {0001} plane is cut out from an SiC single crystal.

In the present invention, the procedure is based on the premise that general processing is applied to a specimen in order to photograph a basal plane dislocation ({0001} in-plane dislocation) by X-ray topography. Specifically, processing is applied under the following conditions.

That is, a wafer having an offset angle of 10° or less is cut out by slicing an SiC single crystal nearly parallel to a {0001} plane. A wafer having a thickness suitable for X-ray topography measurement is produced by shaving and grinding and thus flattening the wafer surface and further removing a damaged layer on the surface. CMP treatment is preferably used for removing a damaged layer.

If a wafer is too thin, a measured region is localized in the thickness direction, resultantly an average dislocation structure in a crystal cannot be evaluated, and the measured value of an orientation intensity tends to vary. If a wafer is too thick in contrast, X-rays hardly penetrate. Consequently, the thickness of a wafer is preferably 100 to 1,000 μm, yet preferably 300 to 1,000 μm, still yet preferably 300 to 700 μm., and further preferably 400 to 600 μm.

[5.2. X-Ray Topography: Procedure (b)]

Successively, X-ray topography measurement by transmission arrangement is applied to the wafer and X-ray topography images corresponding to three crystallographically-equivalent {1-100} plane diffractions are photographed.

In the present invention, the procedure is based on the premise that the procedure is carried out under ordinary X-ray topography measurement conditions for detecting a basal plane dislocation image. Specifically, the measurement is applied under the following conditions;

Arrangement: transmission arrangement (Lang method, refer to FIG. 3), and

Diffraction conditions and measurement plane: {1-100} plane diffraction is used. This is diffraction mainly aimed at detecting a dislocation or a fault having a Burgers vector in a {0001} in-plane direction and a {0001} in-plane stacking fault can also be detected. An identical region of a crystal is measured by the combination of three crystallographically-equivalent planes having different angles. The three planes are a (1-100) plane, a (−1010) plane, and a (01-10) plane.

[5.3. Digitization and Image Preprocessing of Topography Image: Procedure (c)]

Successively, each of the three X-ray topography images is transformed into a digital image obtained by quantifying the brightness of each point in the image and each of the three digital images is comparted into a measurement region having a size of 10±0.1 mm.

In the present invention, the procedure is based on the premise that general processing is applied in order to carry out image analysis. Specifically, digitization and image preprocessing are carried out under the following conditions.

(1) A topography image obtained on a film or a nuclear emulsion plate is digitized with a scanner or the like. The scanning conditions at the digitization are shown below:

Resolution: 512 pixels/cm or more in the actual size of a film, and

Mode: gray scale.

(2) A digitized topography image (digital image) is comparted into a square measurement region where the length L of each side is 10±0.1 mm. When the size of a wafer is relatively large, the wafer surface is comparted into squares and a plurality of measurement regions are taken out. In general, if a measurement region is too small, the measurement is localized and the result to an average structure of a dislocation in a crystal is not obtained. In contrast, if a measurement region is too large, a basal plane dislocation image is too thin and obscure and orientation is hard to examine.

(4) The gray level of a digital image is adjusted so as to be able to obtain a clear basal plane dislocation image. Specifically, the part of a basal plane dislocation is adjusted to darkest (black) and a part other than a dislocation is adjusted to lightest (white).

(5) The number of pixels on a side is adjusted to 512 pixels. If the number of pixels is too small, a clear basal plane dislocation image is not obtained. In contrast, if the number of pixels is too large, Fourier transformation treatment becomes slow.

[5.4. Image Analysis: Procedure (d)]

Successively, two-dimensional Fourier transformation treatment is applied to each of the digital images in the three measurement regions corresponding to an identical region on a wafer and a power spectrum (spectrum of the amplitude A of a Fourier coefficient) is obtained.

The principle of image analysis by two-dimensional Fourier transformation is described in detail in the following literatures for example;

(1) Toshiharu Enomae, “Novel techniques for analyzing physical properties of paper using image processing”, Kami Parupu Gijitsu Times (Pulp and Paper Technology Times), 48 (11), 1-5 (2005) (Reference Literature 1), (2) Enomae, T., Han, Y.-H. and Isogai, A., “Fiber orientation distribution of paper surface calculated by image analysis”, Proceedings of International Papermaking and Environment Conference, Tianjin, P.R. China (May 12-14), Book 2, 355-368 (2004) (Reference Literature 2), (3) Enomae, T., Han, Y.-H. and Isogai, A., “Nondestructive determination of fiber orientation distribution of fiber surface by image analysis”, Nordic Pulp Research Journal 21(2): 253-259 (2006) (Reference Literature 3), (4) http://psi.fp.a.u-tokyo.ac.jp/hp/enomae/FiberOri/ (as of April, 2011) (Reference URL 1).

[5.5. Computation of $A'_{ave.}(\theta_1)$/B.G.($\theta_i$) Ratio: Procedures (e) to (g)]

Successively, each of the three power spectra is converted into a polar coordinate function and a function $A_{ave.}(0)$ of angle (direction) dependency of an average amplitude A is obtained (0°≤θ≤180°) (procedure (e)). In the conversion into a polar coordinate function, the following processing is applied. In a power spectrum, an average amplitude A at an angle θ in the counterclockwise direction from 0° of the x-axis direction is computed. That is, θ is equally divided in the range of 0° to 180° and the average of the amplitudes of Fourier coefficients from the center to the end of a power spectrum is obtained at each angle.

Successively, an integrated value $A'_{ave.}(\theta)$ of the three $A_{ave.}(\theta)$'s is shown in a graph (x-axis: θ, y-axis: and the ratio of a peak value $A'_{ave.}(\theta_i)$ to a background B.G.($\theta_i$) (=$A'_{ave.}(\theta_i)$/B.G.($\theta_i$) ratio) is computed at each of three $\theta_i$'s (i=1 to 3) corresponding to the three <1-100> directions (procedure (f)). When all of the three $A'_{ave.}(\theta_i)$/B.G.($\theta_i$) ratios thus obtained are 1.1 or more, the region of the wafer corresponding to the three measurement regions is judged as an “orientation region” (procedure (g)).

In the graph of an integrated value $A'_{ave.}(\theta)$, the ratio of a peak value $A'_{ave.}(\theta_i)$ to a background B.G.($\theta_i$) (=$A'_{ave.}(\theta_i)$/B.G.($\theta_i$) ratio) is computed for each of the three $\theta^i$'s (i=1 to 3) corresponding to the <1-100> directions.

“A background B.G.($\theta_i$)” means the distance from the x-axis to a background line at the position of $\theta_i$. “A background line” means a tangent line touching the bottom end of the graph of the integrated value $A'_{ave.}(\theta)$ in the vicinity of $\theta_i$.

When a clear peak is shown at each of the three $\theta_i$'s (i=1 to 3) corresponding to the <1-100> directions by applying appropriate image processing, the region on the wafer corresponding to the measurement regions is judged as an “orientation region”. “A clear peak” means that an $A'_{ave.}(\theta_i)$/B.G.($\theta_i$) ratio (i=1 to 3) is 1.1 or more.

In Fourier transformation, a peak appears in a direction perpendicular to an actual orientation direction. In a crystal structure of a hexagonal system such as SiC, the direction perpendicular to the <11-20> direction is the <1-100> direction. That is, that a peak appears in the <1-100> direction by Fourier transformation represents that a basal plane dislocation is oriented to the <11-20> direction. Further, that an orientation intensity B (=average of the three $A'_{ave.}(\theta_i)$/B.G.($\theta_i$) ratios) is large represents that the orientation of a basal plane dislocation to the <11-20> direction is high.

[6. Manufacturing Method of SiC Single Crystal]

An SiC single crystal according to the present invention can be manufactured by (1) manufacturing an SiC single crystal having a low screw dislocation density (a-plane grown crystal) by repeating a-plane growth, (2) cutting out a first seed crystal for c-plane growth having a relatively large offset angle $\theta_i$ to a {0001} plane from the a-plane grown crystal, (3) manufacturing a first SiC single crystal by using the first seed crystal and applying c-plane growth, (4) cutting out a second seed crystal for c-plane growth having an offset angle $\theta_2$, which is smaller than $\theta_1$, to the {0001} plane from the first SiC single crystal, (5) manufacturing a second SiC single crystal by using the second seed crystal and applying c-plane growth, and (6) if necessary, repeating (2) to (5) predetermined number of times.

When c-plane growth is applied, a screw dislocation generating region to supply screw dislocations to a c-plane facet is formed at an end on the upstream side in the offset direction of a seed crystal. In the case of manufacturing an SiC single crystal by using the above method, when a screw dislocation generating region is formed on the surface of a seed crystal so that the density of screw dislocations supplied to a c-plane facet may fall in the range of 5 to 100 pieces/cm$^2$, a single crystal of a very small dislocation density is obtained in comparison with a conventional method.

Figure 7:
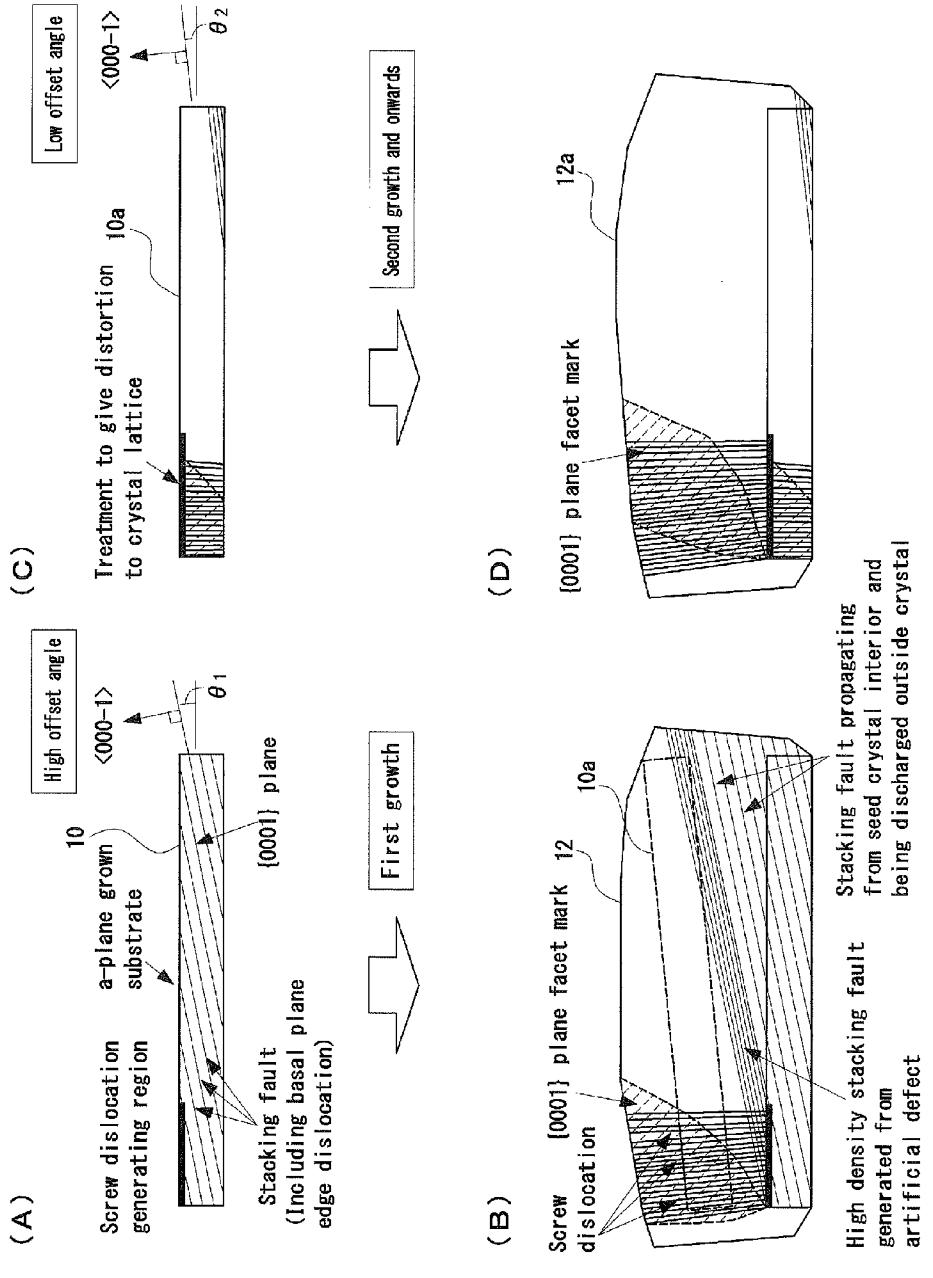
FIGS. 7A to 7D are schematic illustrations showing a manufacturing method of an SiC single crystal according to the present invention.

FIG. 7 shows a schematic illustration of a manufacturing method of an SiC single crystal according to the present invention.

FIG. 7A shows a schematic sectional illustration of a first seed crystal. In a first seed crystal 10 shown in FIG. 7A, the bottom plane of the seed crystal is not parallel to a {0001} plane. It is a so-called “offset substrate” and is a high offset angle substrate having a relatively large offset angle $\theta_1$. Further, the first seed crystal 10 is a tabular seed crystal cut out from an a-plane grown crystal (a-plane grown substrate). Consequently, the first seed crystal 10 includes stacking faults nearly parallel to the {0001} plane and basal plane edge dislocations each of which has a Burgers vector in a direction parallel to a <0001> direction relatively abundantly. Further, in the first seed crystal 10, a screw dislocation generating region is formed at an end on the upstream side in the offset direction. The screw dislocation generating region has to be formed so that the density of screw dislocations supplied into a c-plane facet of a grown crystal may fall in the above range.

When first growth (first growth process) is carried out by using such a first seed crystal 10, a first SiC single crystal (grown crystal) 12 is obtained as shown in FIG. 7B. On this occasion, screw dislocations of a prescribed density are generated from the screw dislocation generating region and are supplied into the c-plane facet. As a result, it is possible to inhibit heterogeneous polytype caused by the lack of screw dislocations in the c-plane facet from being generated.

In the case of carrying out high offset angle growth, however, when a screw dislocation generating region (artificial defect section) is formed on the surface of the first seed crystal 10, stacking faults of a high density and basal plane edge dislocations each of which has a Burgers vector in a direction parallel to the <0001> direction are generated from the artificial defect section. Further, a stacking fault having existed in the first seed crystal 10 from the beginning also propagates into the grown crystal and is discharged outside the grown crystal. That is, the first SiC single crystal 12 includes relatively many stacking faults and basal plane edge dislocations each of which has a Burgers vector in a direction parallel to the <0001> direction.

Successively, a second seed crystal 10*a* is cut out, from the first SiC single crystal 12 so as to satisfy the expression $\theta_2<\theta_1$ and have an offset inclination nearly in the same direction. FIG. 7C shows a schematic sectional view of the cutout second seed crystal 10*a*. The second seed crystal 10*a* shown in FIG. 7C is a low offset angle substrate having a relatively small offset angle $\theta_2$. For example, when $\theta_1$ is 8°, $\theta_2$ is set at 4°. Further, when the growth height of the first SiC single crystal 12, the cutout position of the second seed crystal 10*a*, and the like are optimized, as shown in FIG. 7C, the second seed crystal 10*a* that does not expose a stacking fault propagating into the first SiC single crystal 12 on the growth surface is obtained. Further, the second seed crystal 10*a* includes screw dislocations of a prescribed density taking over from the first SiC single crystal 12 at an end on the upstream side in the offset direction. Consequently, the cutout second seed crystal 10*a* may be used as it is but, in the example shown in FIG. 7C, a process of giving distortion to a crystal lattice is further applied to the end on the upstream side in the offset direction.

Here, even when distortion is given to a crystal lattice, it is necessary to apply processing so that the density of the screw dislocations supplied into the c-plane facet of a grown crystal may fall in the above range.

When second growth (second growth process) is carried out by using such a second seed crystal 10*a*, a second SiC single crystal 12*a* is obtained as shown in FIG. 7D. On this occasion, screw dislocations of a prescribed density are generated from the screw dislocation generating region and are supplied into the c-plane facet. As a result, it is possible to: inhibit heterogeneous polytype caused by the lack of screw dislocations in the c-plane facet from being generated; and considerably reduce the leakage of dislocations such as basal plane dislocations and threading edge dislocations from the screw dislocation generating region and the c-plane facet into the interior of the grown crystal.

Further, even when an artificial defect section is formed on the surface of the second seed crystal 10*a*, since the offset angle $\theta_2$ is small, it does not happen that some of the screw dislocations generated from the artificial defect section are converted into stacking faults and flow out toward the downstream side in the offset direction. Moreover, since the majority of the stacking faults are already discharged outside the grown crystal at the first growth process, stacking faults exposed in a high quality region existing on the downstream side in the offset direction are few. As a result, the probability of generating screw dislocations from the interface between the seed crystal and the grown crystal is also low.

[7. SiC Wafer]

An SiC wafer according to the present invention is a wafer cut out from an SiC single crystal according to the present invention. When manufacturing conditions are optimized, an SiC wafer having a low dislocation density region (A) accounting for not less than 50% of the wafer surface area is obtained.

Here, "a low dislocation density region (A) accounting for not less than 50% of the wafer surface area" means that the area of a low dislocation density region (A) exposed on a wafer surface accounts for not less than 50% of the wafer surface area.

When manufacturing conditions are further optimized, the proportion of a low dislocation density region (A) to a wafer surface area is not less than 70% or not less than 90%.

Further, in an SiC wafer generally, a dislocation density increases toward the center of the wafer. In contrast, in the case of using a method according to the present invention, when manufacturing conditions are optimized, an SiC wafer having a low dislocation density region (A) in the center of the wafer surface is obtained.

Here, "having a low dislocation density region (A) in the center of a wafer" means that a measurement region including the gravity center of the wafer is the low dislocation density region (A).

Otherwise, when manufacturing conditions are optimized, an SiC wafer having a low dislocation density region (A) accounting for the region excluding the region between the outer circumference and 1 cm inside the outer circumference of the wafer is obtained.

Moreover, when a method according to the present invention is used, an SiC wafer having not only a high quality but also a large diameter is obtained. Specifically, by optimizing manufacturing conditions, a high quality SiC wafer having a diameter of not less than 7.5 cm, not less than 10 cm, or not less than 15 cm is obtained.

A crystal plane constituting the surface of a wafer is not particularly limited and can be selected arbitrarily in accordance with the purpose.

That is, the surface of a wafer may be any one of a plane parallel to a {0001} plane (c-plane), a plane somewhat inclining from a c-plane, a plane vertical to a {0001} plane (a-plane), and a plane somewhat inclining from an a-plane.

An obtained wafer is used for various applications as it is or in the state of forming a thin film on the surface. For example, when a semiconductor device is manufactured with a wafer, an epitaxial film is formed on the wafer surface. As an epitaxial film, specifically SiC, nitride such as GaN, etc. are named.

[8. Semiconductor Device]

A semiconductor device according to the present invention is manufacture by using an SiC wafer according to the present invention. As a semiconductor device, specifically there is (a) an LED, or (b) a diode or a transistor for a power device.

[9. Effect of SiC Single Crystal, SiC Wafer, and Semiconductor]Device

In the case of repeating c-plane growth of an SiC single crystal several times, when a screw dislocation generating region is formed at an end of a seed crystal on the upstream side in an offset direction so that the offset angle of the seed crystal surface may satisfy specific conditions and the density of screw dislocations introduced into a c-plane facet may be maintained in a prescribed range, an SiC single crystal having a short total dislocation length per unit volume is obtained.

In a wafer cut out from such an SiC single crystal nearly parallel to a {0001} plane, not only the number of basal plane dislocations but also the number of threading edge dislocations is small. As a result, even when an SiC single crystal growth is carried out by using such a wafer as a seed crystal or an epitaxial film is formed on the surface of the wafer, the density of threading dislocations in a grown crystal or in the epitaxial film lowers. The term "threading dislocations" means both threading edge dislocations and threading screw dislocations but the threading edge dislocations account for the majority. Consequently, when a semiconductor device is manufactured by using such an SiC single crystal, it is possible to considerably suppress device leak current caused by such dislocations.

EXAMPLES

Example 1

[1. Manufacturing of Specimen]

A 4H—SiC single crystal was manufactured by a method shown in FIG. 7. A wafer A nearly parallel to a {0001} plane and a wafer B nearly vertical to a {0001} plane and nearly parallel to a {1-100} plane were taken out from the obtained single crystal. The takeout method was a method of taking out the wafer A and the wafer B from two crystals grown nearly under the same conditions respectively as shown in FIG. 4A. Actually, plural wafers A and plural wafers B were cut out from adjacent sites respectively.

Successively, specimens for evaluation having a thickness of 500 μm were prepared by applying flattening treatment and damage layer removing treatment to the surfaces.

[2. X-ray Topography Measurement and Computation of Dislocation Density]

[2.1. Basal Plane Dislocation Having Burgers Vector in a {0001} In-Plane Direction (Mainly a Direction Parallel to a <11-20> Direction)]

With regard to a first wafer A cut out nearly parallel to a {0001} plane, X-ray topography images of (1-100) plane diffraction, (−1010) plane diffraction, and (01-10) plane diffraction, which are crystallographically-equivalent three diffractions, were obtained. Low density basal plane dislocation images were observed in the obtained X-ray topography images. The X-ray topography images were taken in with a scanner and digitized. The digitized X-ray topography images of the basal plane dislocations were comparted into regions of 10 mm square.

Figure 8:
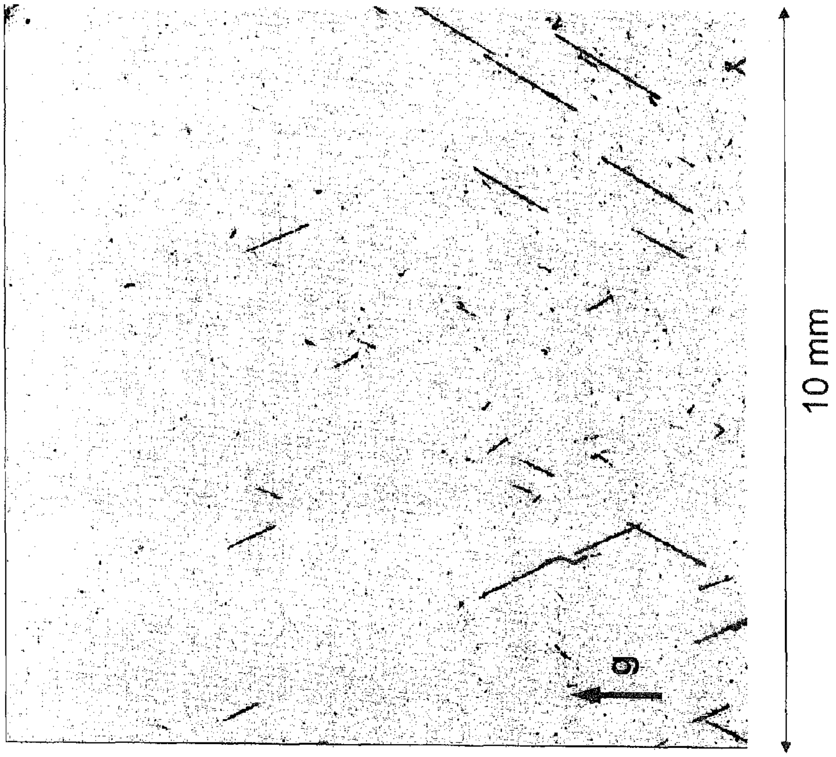
FIG. 8 is an image of a 10-mm square region extracted and expanded from the vicinity of the center of a (1-100) plane diffraction X-ray topography image of a wafer A cut out from an SiC single crystal obtained by a method according to the present invention.
Figure 9:
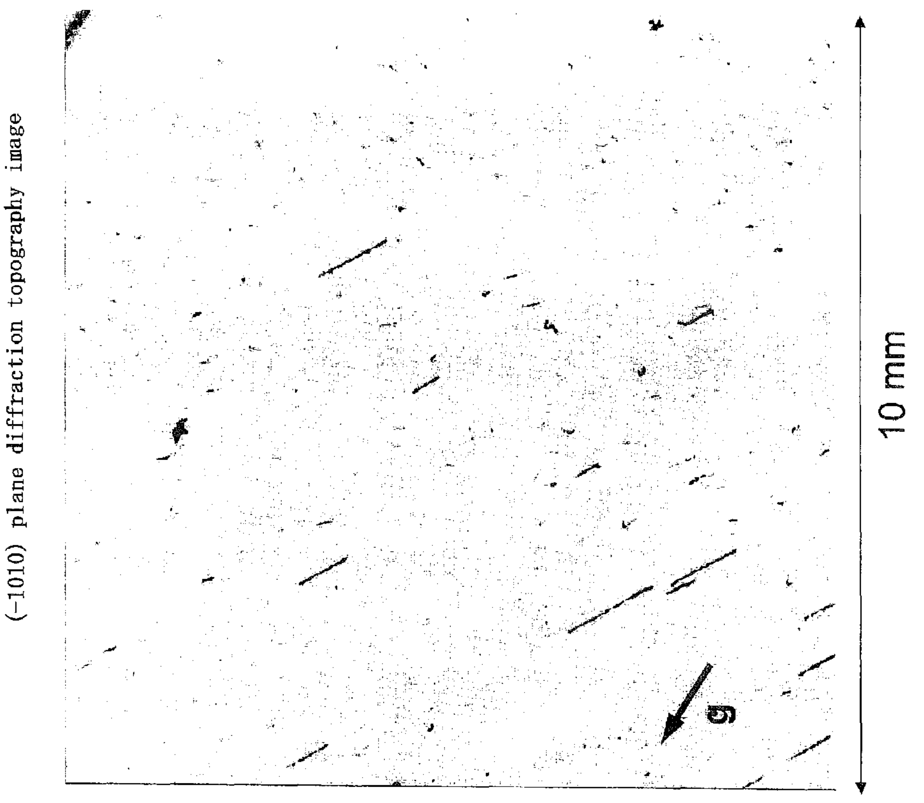
FIG. 9 is an image of a 10-mm square region (the same region as FIG. 8) extracted and expanded from the vicinity of the center of a (−1010) plane diffraction X-ray topography image of a wafer A cut out from an SiC single crystal obtained by a method according to the present invention.
Figure 10:
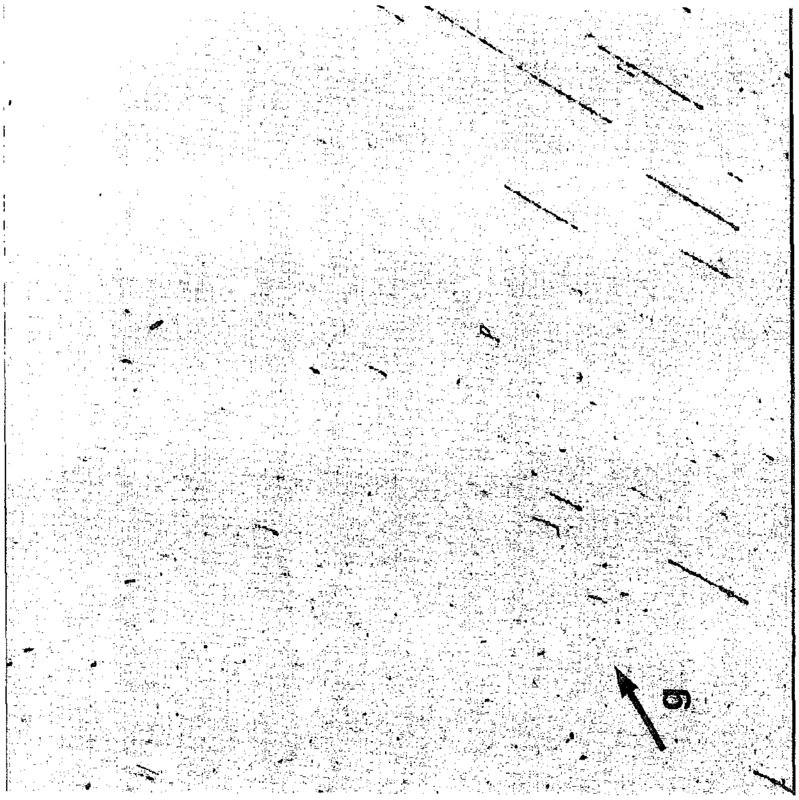
FIG. 10 is an image of a 10-mm square region (the same region as FIG. 8) extracted and expanded from the vicinity of the center of a (01-10) plane diffraction X-ray topography image of a wafer A cut out from an SiC single crystal obtained by a method according to the present invention.

FIGS. 8 to 10 show examples of the images of 10-mm square regions extracted and expanded from the vicinities of the centers of a (1-100) plane diffraction image, a (−1010) plane diffraction image, and a (01-10) plane diffraction image in an identical region, respectively. The results obtained by measuring the total lengths of the basal plane dislocations in the respective images were 23.3 mm in the (1-100) plane diffraction image, 10.5 mm in the (−1010) plane diffraction image, and 13.9 mm in the (01-10) plane diffraction image. As described earlier, a dislocation line was detected in two diffraction images and disappeared in one diffraction image. Consequently, an average total length was obtained by summing the respectively obtained total lengths of the basal plane dislocations and dividing the sum by two and the resultant value was 23.8 mm. Successively, the density of the basal plane dislocations was computed by multiplying the value by 10 mm/wafer thickness (mm) and the resultant value was 47.6 cm/cm$^3$.

Further, also with regard to other wafers A cut out from adjacent sites, in a 10-mm square region located in the vicinity of the center of each of the X-ray topography images, the total length of basal plane dislocations was measured and the density of the basal plane dislocations per cm$^3$ was computed. As a result, all of the wafers A showed nearly identical values.

Figure 11:
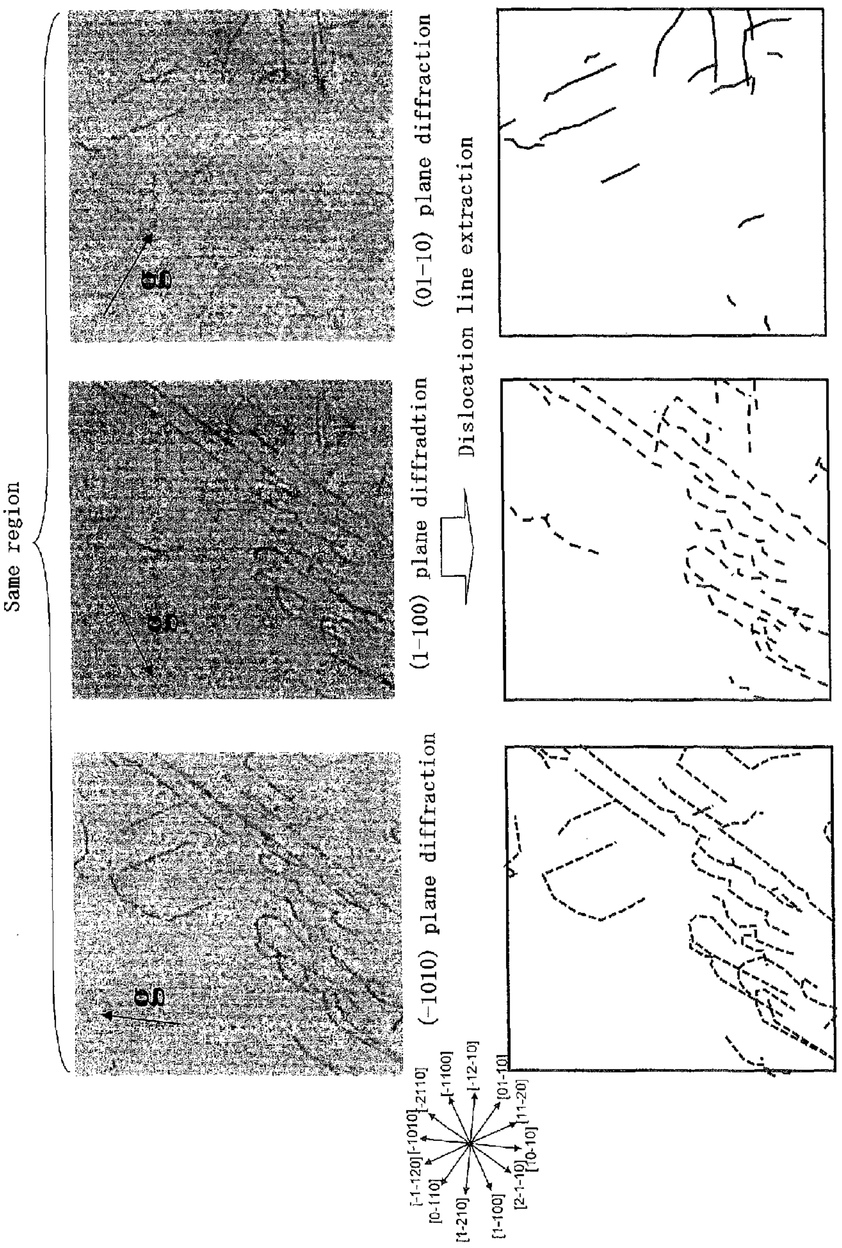
FIG. 11 includes X-ray topography images of (−1010) plane diffraction, (1-100) plane diffraction, and (01-10) plane diffraction photographed in an identical region on a wafer (upper figures) and schematic illustrations of the dislocation lines extracted from the X-ray topography images (lower figures)
Figure 12:
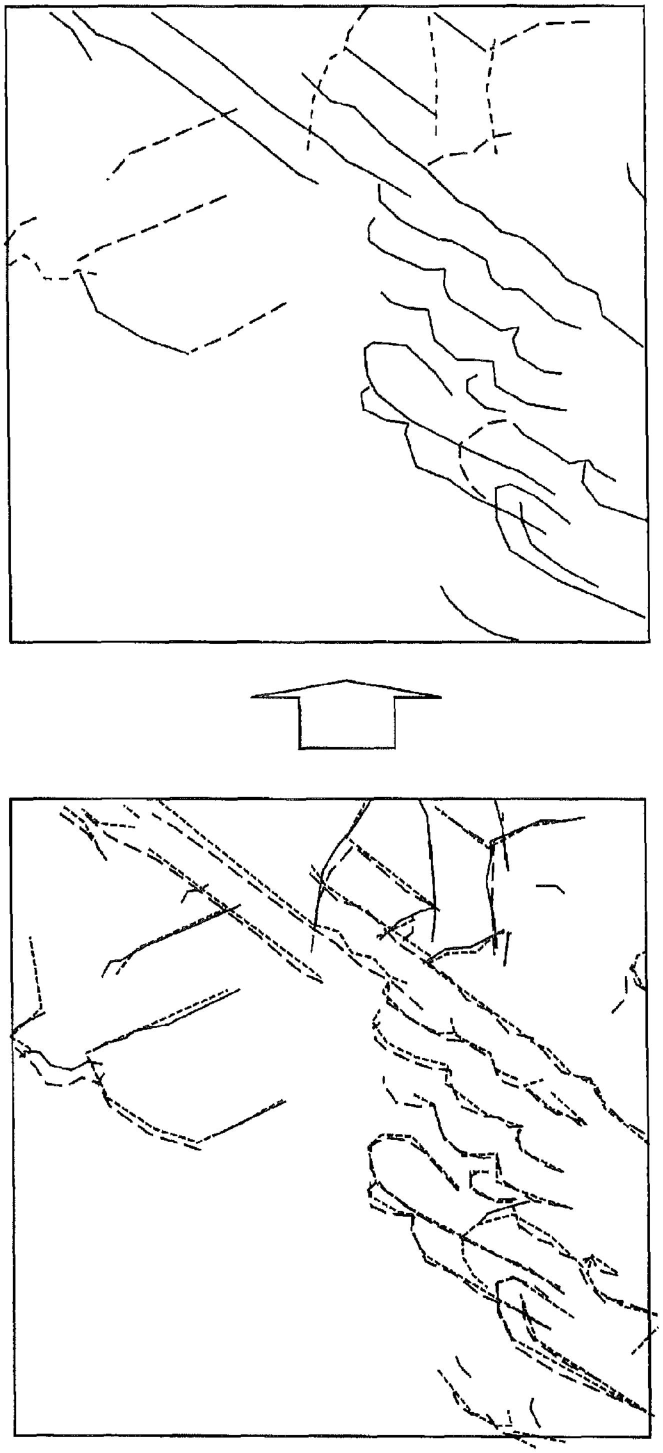
FIG. 12A is a view formed by superimposing the three schematic illustrations of the dislocation lines shown in the lower figures of FIG. 11.
FIG. 12B is a schematic illustration of classifying the dislocations into dislocations having the same Burgers vectors.

A wafer was taken out from a crystal having relatively many dislocations in order to explain the orientation of a Burgers vector of a dislocation. FIG. 11 shows X-ray topography images of (−1010) plane diffraction, (1-100) plane diffraction, and (01-10) plane diffraction photographed in an identical region on the wafer (upper figures) and schematic illustrations of the dislocation lines extracted from the respective X-ray topography images (lower figures). FIG. 12A shows a view formed by superimposing the three schematic illustrations of the dislocation lines shown in the lower figures of FIG. 11, and FIG. 12B shows a schematic illustration showing the result of classifying the dislocations into dislocations having Burgers vectors in identical directions.

As shown in FIG. 12A, any of the dislocation lines disappeared under one diffraction condition in the three diffraction conditions and there was no dislocation that was detected in all the diffraction images. A dislocation line, even it curves, has an identical Burgers vector (namely a Burgers vector oriented to a single direction and in a direction on a diffraction plane) over the whole dislocation line.

Figure 13:
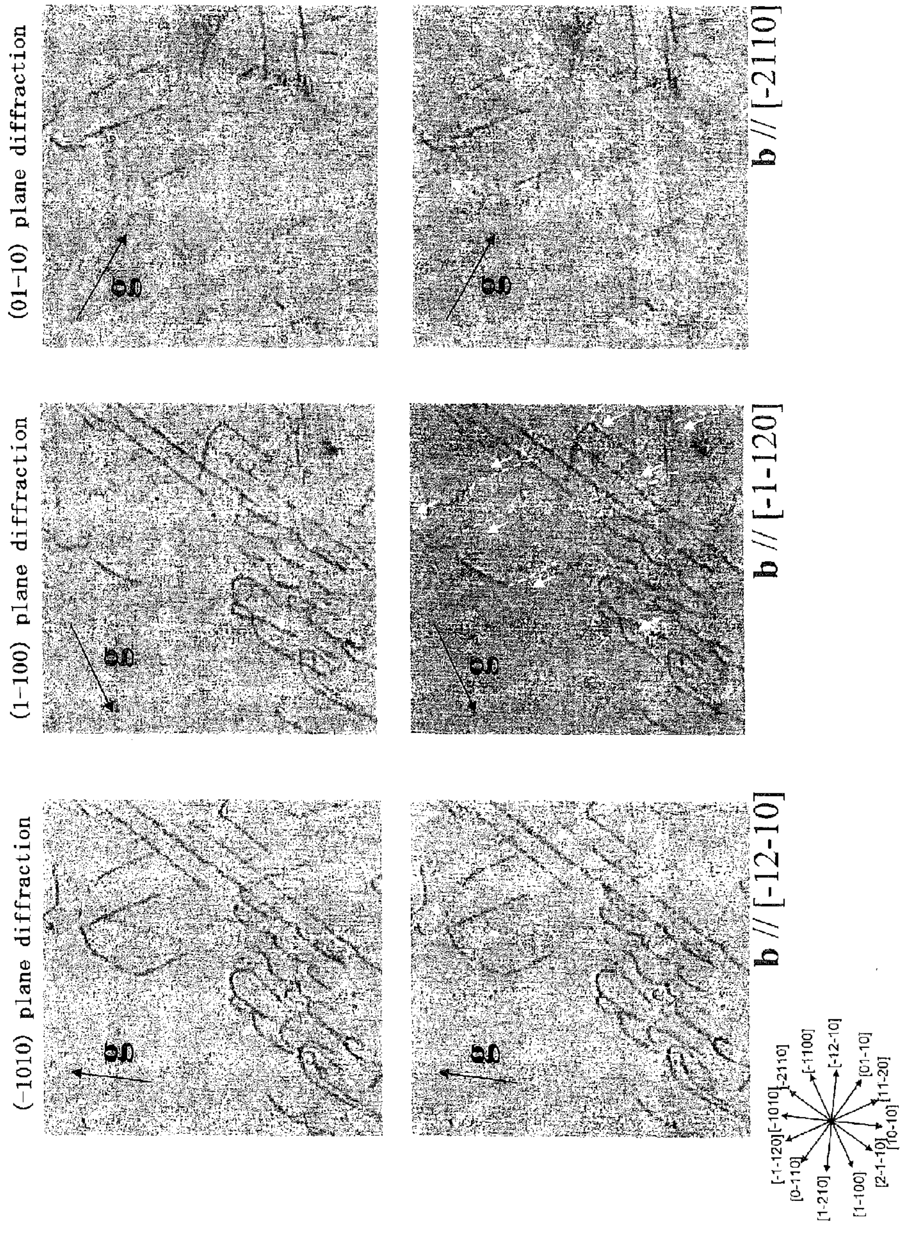
FIG. 13 includes X-ray topography images of (−1010) plane diffraction, (1-100) plane diffraction, and (01-10) plane diffraction photographed in an identical region of a wafer (upper figures) and images showing the dislocation images having disappeared in the X-ray topography images with the dotted lines (lower figures)

FIG. 13 shows X-ray topography images of (−1010) plane diffraction, (1-100) plane diffraction, and (01-10) plane diffraction photographed in an identical region on a wafer (upper figures) and images showing the dislocation images having disappeared in the X-ray topography images with the dotted lines (lower figures).

That a dislocation line disappears under a diffraction condition means that the Burgers vector thereof is vertical to a g vector (a normal vector of a diffraction plane). In FIG. 13, the direction of the Burgers vector of each of the dislocations shown with the dotted lines is shown by a white arrow. From FIG. 13, it is obvious that each of the Burgers vectors is oriented to a direction parallel to a <11-20> direction. Further, it is obvious that each of the basal plane dislocations has a Burgers vector in a direction parallel to a <11-20> direction regardless of whether it has linearity (Burgers vector conservation law). A dislocation line in a direction parallel to a Burgers vector shows that it is a screw dislocation.

[2.2. Threading Dislocation (Threading Edge Dislocation) Having Burgers Vector in a {0001} in-Plane Direction (Mainly a Direction Parallel to a <11-20> Direction)]

With regard to a first wafer B cut out nearly vertical to a {0001} plane and nearly parallel to a {1-100} plane, an X-ray topography image of (11-20) plane diffraction was obtained. Threading edge dislocations nearly parallel to a <000-1> direction were observed in the X-ray topography image. Basal plane dislocations on a {0001} plane were scarcely observed. This coincides with the fact that the density of the basal plane dislocations is very low in a wafer A. The obtained X-ray topography image was taken in with a scanner and digitized. The conditions of the take-in were a gray scale and a resolution of about 1,000 pixels/cm. The digitized X-ray topography image of the threading edge dislocations was comparted into regions of 10 mm square and thereafter a 10-mm square region was extracted from the vicinity of the center (the left photograph in FIG. 14).

Figure 14:
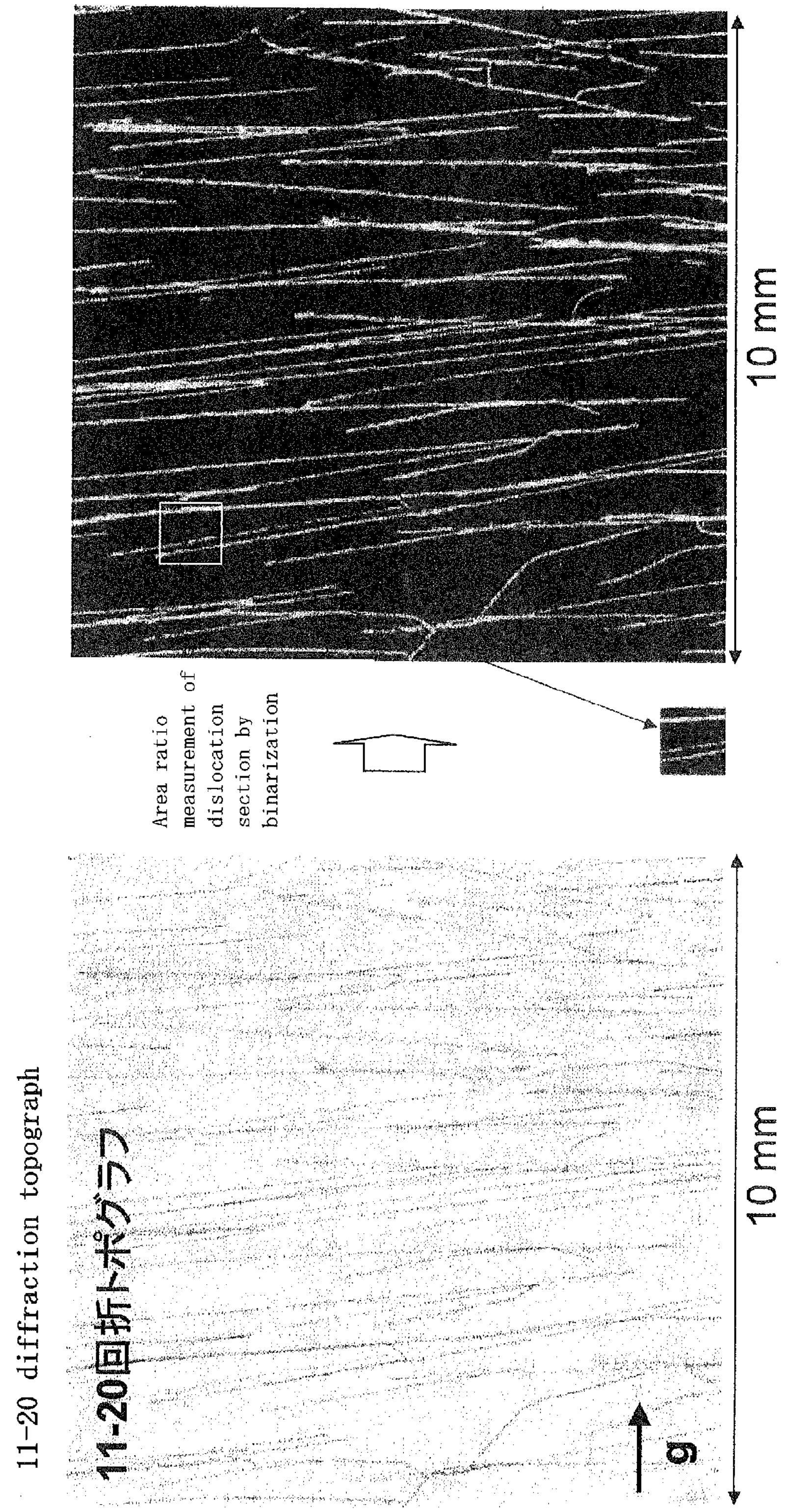
FIG. 14 includes a (11-20) plane diffraction X-ray topography image of a wafer B cut out from an SiC single crystal obtained by a method according to the present invention (left figure), an image obtained by binarizing the (11-20) plane diffraction X-ray topography image (right figure), and a reference region used for computing a dislocation length (small figure in the lower center)

Since the number of the detected threading edge dislocations was relatively large, not the dimensions of all of them were measured but the total length of the dislocations in the image was measured with the image analysis software stated earlier (the right photograph in FIG. 14). As a result, the total length of the threading edge dislocations in the 10-mm square region of the X-ray topography image was 308.4 mm. The density of the threading edge dislocations per cm$^3$ was computed by multiplying the value by 10 mm/wafer thickness (mm) and resultantly was 616.8 cm/cm$^3$.

Further, with regard to other wafers B cut out from adjacent sites likewise, in a 10-mm square region located in the vicinity of the center of each of the X-ray topography images, the total length of the threading edge dislocations was measured and the density of the threading edge dislocations per cm$^3$ was computed. As a result, all of the wafers B showed nearly identical values.

[2.3. Dislocation (Basal Plane Edge Dislocation and Threading Screw Dislocation) Having Burgers Vector in a Direction Parallel to a <000-1> Direction]

With regard to a wafer B vertical to a {0001} plane and parallel to a {1-100} plane, an X-ray topography image of (0004) plane diffraction was obtained. A dislocation image was not observed at all in the X-ray topography image.

[3. Total Dislocation Density]

Table 1 shows a summary of the total lengths of (a) basal plane dislocations each of which has a Burgers vector in a {0001} in-plane direction (mainly a direction parallel to a <11-20> direction), (b) threading edge dislocations each of which has a Burgers vector in a {0001} in-plane direction (mainly a direction parallel to a <11-20> direction), and (c) dislocations each of which has a Burgers vector in a direction parallel to a <000-1> direction, per unit volume obtained from the above X-ray topography measurement. Here, the values of other compartments that will be described later are also shown in Table 1.

In the case of FIGS. 8 to 10, the sum of the densities of the dislocations each of which has a Burgers vector in a {0001} in-plane direction (mainly a direction parallel to a <11-20> direction) was 664.4 cm/cm$^3$ ((a) in Table 1).

Figure 15:
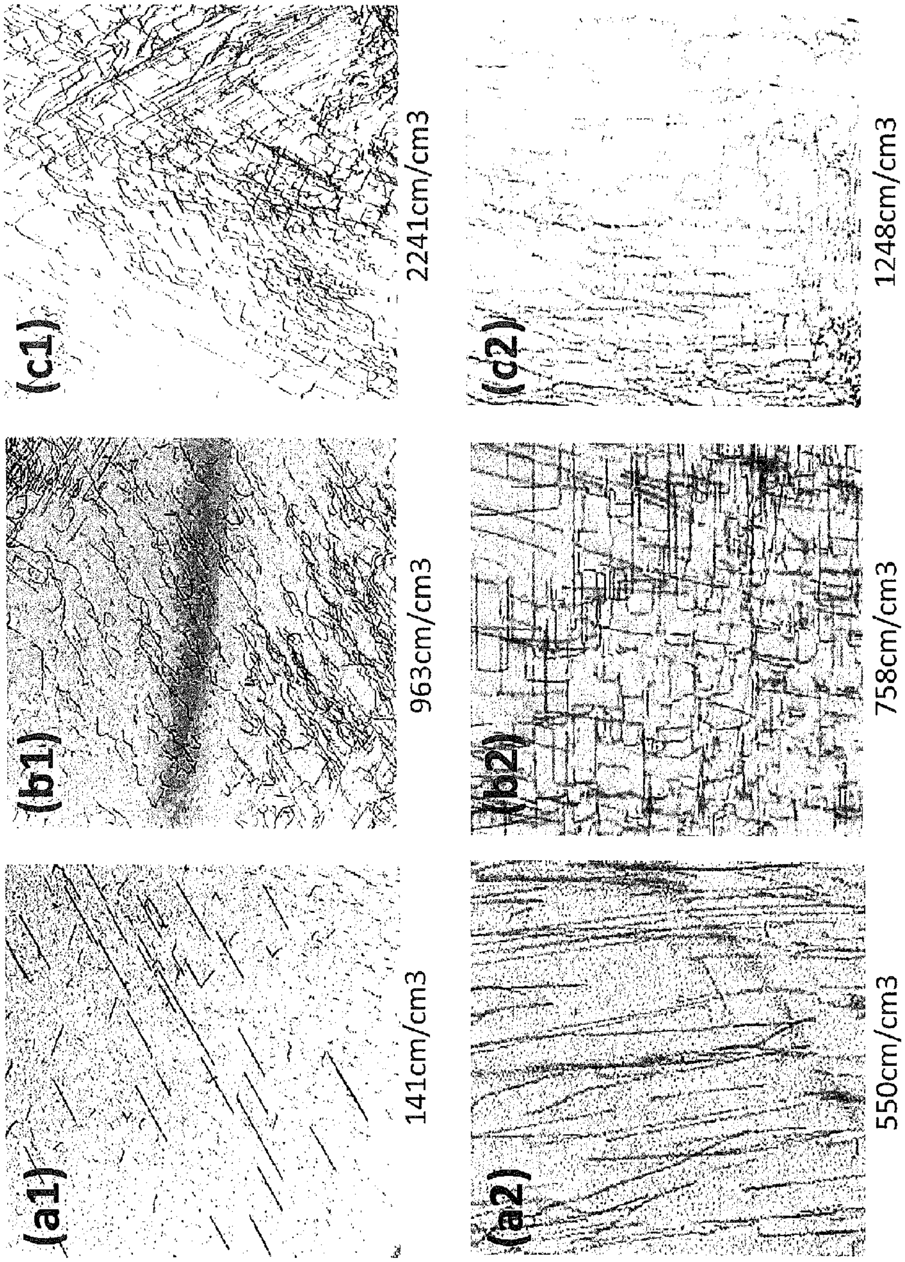
FIGS. 15(*a*1), 15(*b*1), and 15(*c*1) are images of 10-mm square regions extracted and expanded respectively from different positions of a (1-100) plane diffraction X-ray topography image of a wafer A cut out from an SiC single crystal obtained by a method according to the present invention.

With regard to compartments corresponding to other sites in the topography image too, dislocation densities were measured likewise. FIGS. 15(*a*1) to 15(*c*2) show typical topography images at the respective measurement sites. In FIG. 15, the topography images (a1), (b1), and (c1) of the upper stage are the images in 10-mm square regions extracted and enlarged from different sites of a {1-100} plane diffraction X-ray topography image of a wafer A nearly parallel to a {0001} plane cut out from an SiC single crystal respectively. The topography images (a2), (b2), and (c2) of the lower stage are images in 10-mm square regions extracted and enlarged from the sites corresponding to (a1), (b1), and (c1) of a (11-20) plane diffraction X-ray topography image of a wafer B nearly vertical to the {0001} plane cut out from the SiC single crystal respectively. The dislocation densities of the basal plane dislocations and the edge dislocations obtained from the respective topography images are also shown below the topography images.

(a1) and (a2) in FIG. 15 are compartments at sites comparatively apart from an artificial defect section in the crystal. The basal plane dislocation density and the threading edge dislocation density measured from (a1) and (a2) were 141 cm/cm$^3$ and 550 cm/cm$^3$ respectively and the sum of them was 691 cm/cm$^3$ ((b) in Table 1). The value was about the same level as the dislocation density in the compartments of FIGS. 8 to 10, and a region of about not less than 50% of a wafer had a dislocation density nearly equal to the cases of FIGS. 8 to 10 and FIGS. 15 (*a*1) and (*a*2).

(b1) and (b2) in FIG. 15 are compartments at intermediate sites between a center section and the artificial defect section in the crystal. The basal plane dislocation density and the threading edge dislocation density measured from (b1) and (b2) were 963 cm/cm$^3$ and 758 cm/cm$^3$ respectively and the sum of them was 1,721 cm/cm$^3$ ((c) in Table 1).

(c1) and (c2) in FIG. 15 are compartments at sites adjacent to the artificial defect section in the crystal. The basal plane dislocation density and the threading edge dislocation density measured from (c1) and (c2) were 2,241 cm/cm$^3$ and 1,248 cm/cm$^3$ respectively and the sum of them was 3,489 cm/cm$^3$ ((d) in Table 1).

A wafer having a very low threading dislocation density was obtained by cutting out an SiC wafer from an SiC single crystal obtained in Example 1 and applying epitaxial growth. When an SiC diode is manufactured by using it, it is possible to reduce leak current in comparison with an SiC diode manufactured by using a crystal including dislocations nearly equal to a crystal in Comparative example 1 that will be described later.

Comparative Examples 1 and 2

[1. Specimen]

Similar X-ray topography measurement and total dislocation length measurement were applied to an SiC single crystal (single crystal of Non-patent Literature 3) obtained by: using a crystal formed by repeatedly applying a-plane growth as a seed crystal for c-plane growth; and applying c-plane growth at a prescribed offset angle (Comparative example 1).

[2. X-ray Topography Measurement and Computation of Dislocation Density]

[2.1. Basal Plane Dislocation Having Burgers Vector in a {0001} In-Plane Direction (Mainly a Direction Parallel to a <11-20> Direction)]

With regard to a wafer A nearly parallel to a {0001} plane, an X-ray topography image of {1-100} plane diffraction was obtained. A high density basal plane dislocation image was observed in the obtained X-ray topography image. The X-ray topography image was taken in with a scanner, digitized, and comparted into a 10-mm square region.

Figure 16:
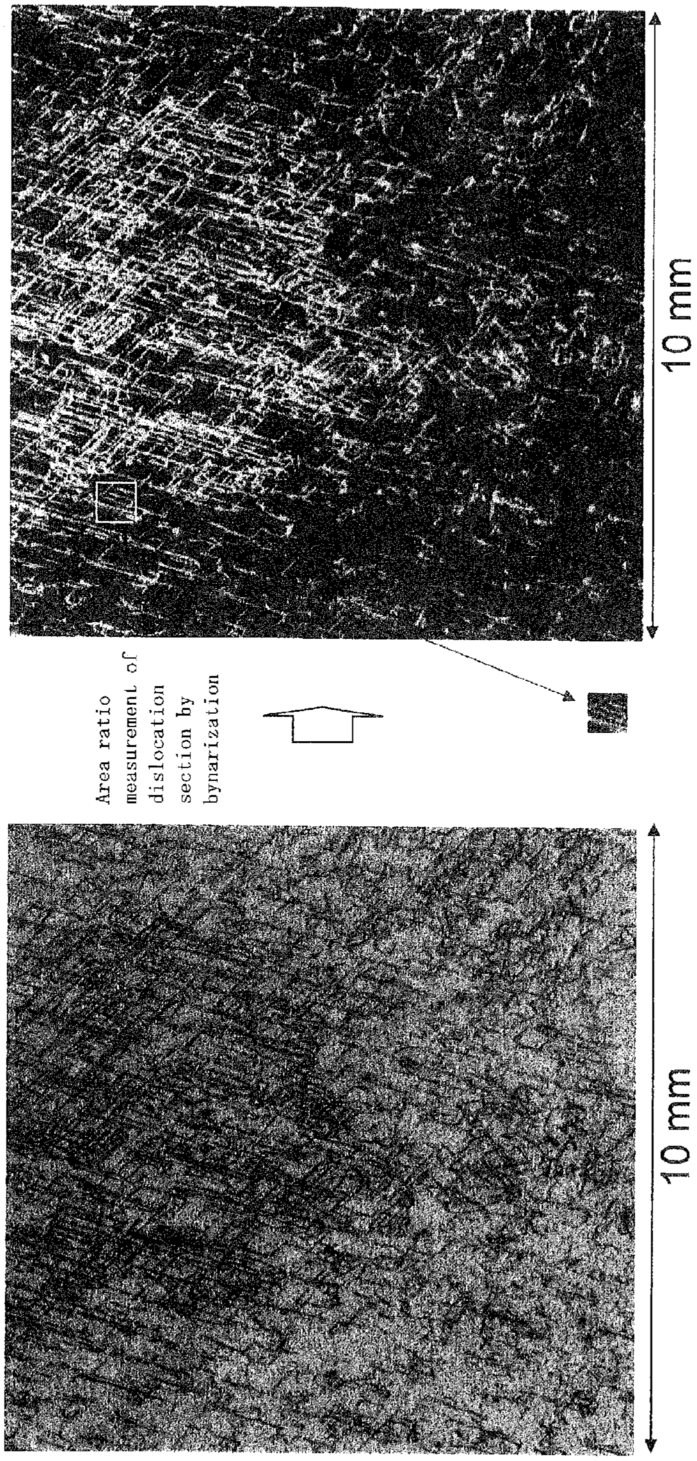
FIG. 16 includes a (1-100) plane diffraction X-ray topography image of a wafer A cut out from an SiC single crystal obtained by a method described in Non-patent Literature 3 (left figure), an image obtained by binarizing the (1-100) plane diffraction X-ray topography image (right figure), and a reference region used for computing a dislocation length (small figure in the lower center)

The X-ray topography image at the left in FIG. 16 is based on a region taken out from a site of a relatively low dislocation density. Since the number of the detected basal plane dislocations was large, not all of the dimensions of them were measured but the total length of the dislocations in the image was measured with the image analysis software described earlier.

As a result, the total length of the basal plane dislocations in the 10-mm square region in the image was 668 mm. The density of the basal plane dislocations was measured by multiplying the value by 1.5 in consideration of basal plane dislocations not detected in the image and further multiplying the value by 10 mm/wafer thickness (mm) and resultantly was 2,505 cm/cm$^3$.

Further, with regard to other wafers A cut out from adjacent sites likewise, in a 10-mm square region located in the vicinity of the center of each of the X-ray topography images, the total length of basal plane dislocations was measured and the density of the basal plane dislocations per cm$^3$ was computed. As a result, all of the wafers A showed nearly identical values.

[2.2. Threading Dislocation (Threading Edge Dislocation) Having Burgers Vector in a {0001} In-Plane Direction (Mainly a Direction Parallel to a <11-20> Direction)]

Figure 17:
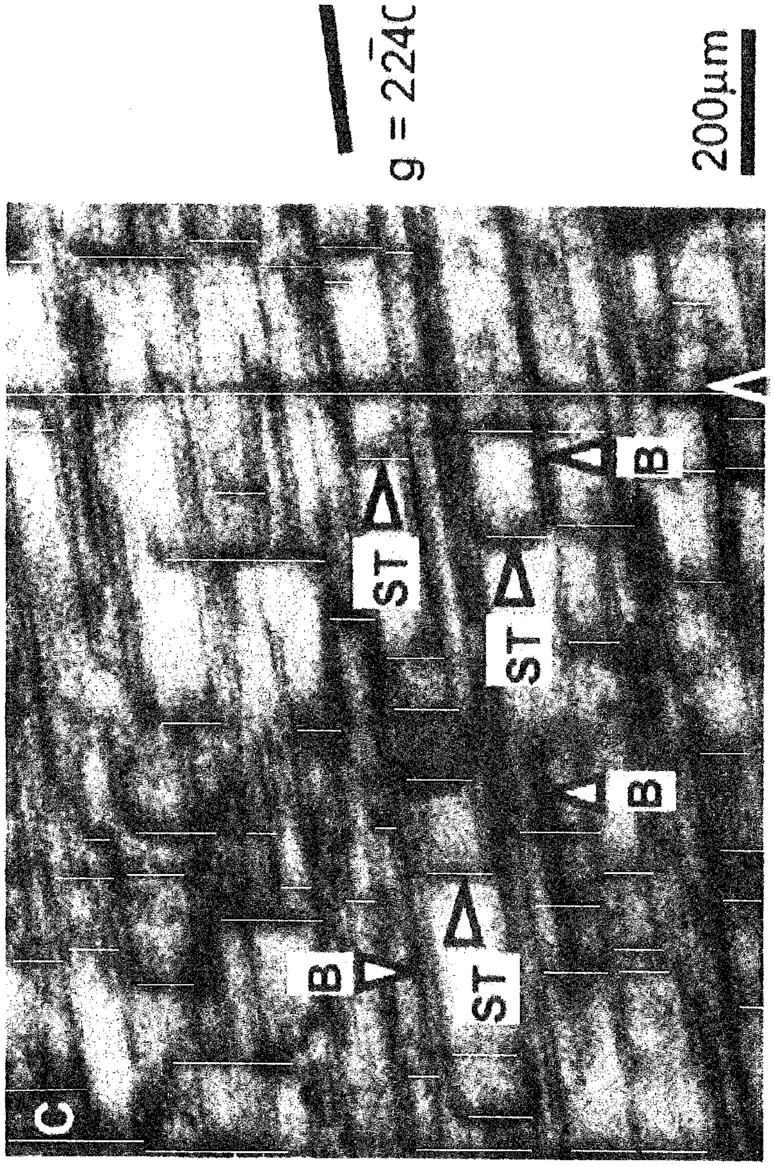
FIG. 17 is a (22-40) plane diffraction X-ray topography image of a wafer B cut out from an SiC single crystal obtained by a method described in Non-patent Literature 3.

FIG. 17 shows an X-ray topography image described in FIG. 4C of Non-patent Literature 3. The density of threading edge dislocations nearly parallel to a <000-1> direction was obtained by using the X-ray topography image in FIG. 17. The X-ray topography image was measured by using {22-40} plane diffraction and detected crystal distortion similar to {11-20} plane diffraction. The threading edge dislocations nearly parallel to a <000-1> direction and the basal plane dislocations parallel to a {0001} plane were observed in the image. This coincides with the fact that the density of the basal plane dislocations is high in a wafer A. The length of only the threading edge dislocations nearly parallel to a <000-1> direction was measured and the density of the threading edge dislocations was computed in the wafer A and resultantly the density was 1,228 cm/cm$^3$.

[2.3. Dislocation (Basal Plane Edge Dislocation and Threading Screw Dislocation) Having Burgers Vector in a Direction Parallel to a <000-1> Direction]

Figure 18:
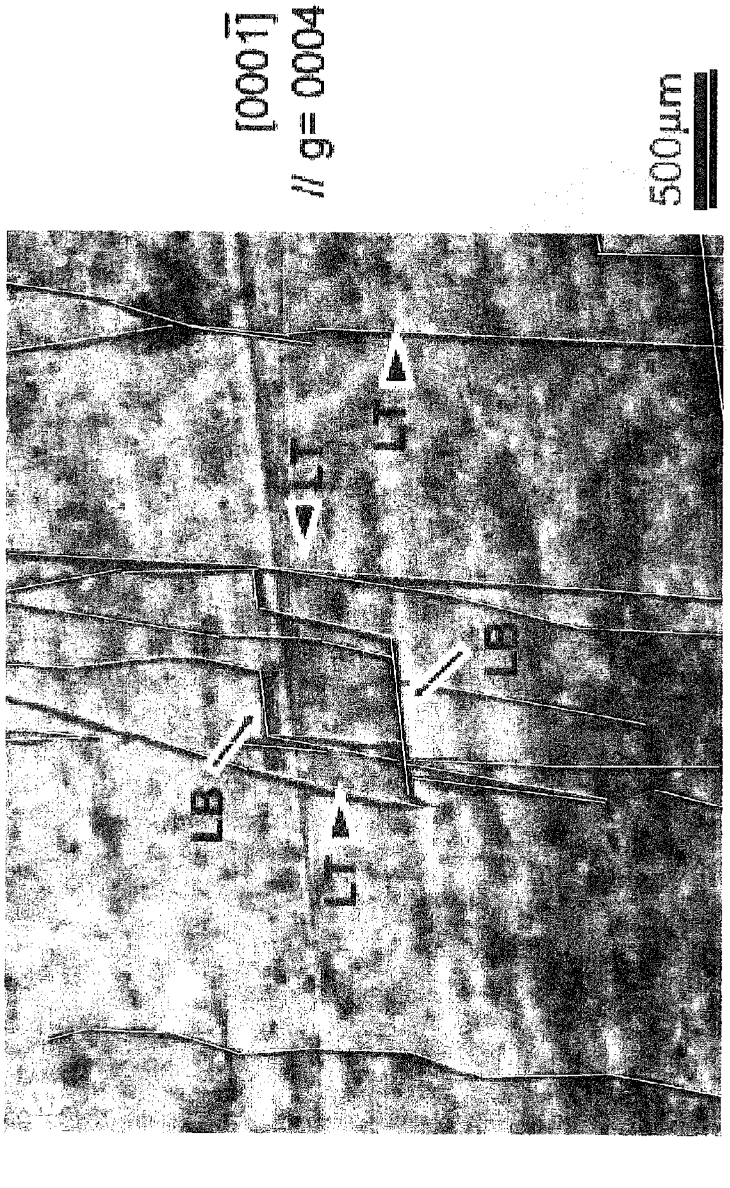
FIG. 18 is a (0004) plane diffraction X-ray topography image of a wafer B cut out from an SiC single crystal obtained by a method described in Non-patent Literature 3.

FIG. 18 shows a {0004} plane diffraction X-ray topography image described in FIG. 4A of Non-patent Literature 3. The length of dislocations each of which has a Burgers vector in a direction parallel to a <000-1> direction was obtained by using the X-ray topography image in FIG. 18. The threading screw dislocations oriented in a direction parallel to a <000-1> direction and the basal plane edge dislocations parallel to a {0001} plane were recognized in FIG. 18. As a result of computing the respective densities in consideration of the area of an image and the thickness of a specimen, the density of the threading screw dislocations was 694 cm/cm$^3$, the density of the basal plane edge dislocations was 49 cm/cm$^3$, and the sum was 743 cm/cm$^3$.

3. Total Dislocation Density

Table 1 shows a summary of the total lengths of
(a) basal plane dislocations each of which has a Burgers vector in a {0001} in-plane direction (mainly a direction parallel to a <11-20> direction),
(b) threading edge dislocations each of which has a Burgers vector in a {0001} in-plane direction (mainly a direction parallel to a <11-20> direction), and
(c) dislocations each of which has a Burgers vector in a direction parallel to a <000-1> direction, per unit volume obtained by the above X-ray topography measurement.

In the case of Comparative example 1, the sum of the densities of the dislocations each of which has a Burgers vector in a {0001} in-plane direction (mainly a direction parallel to a <11-20> direction) was 3,733 cm/cm$^3$.

When an SiC wafer is cut out from a crystal including the same level of dislocations as an SiC single crystal obtained in Comparative example 1 and epitaxial growth is applied, a wafer having a high threading dislocation density is obtained. When an SiC device is manufactured by using it, leak current increases.

Table 2 shows the volume densities of the dislocations in an SiC single crystal obtained in Example 1 and an SiC single crystal in Comparative example 1 (Non-patent Literature 3). Here, the values of Example 1 in Table 2 are representative values. Further, estimated values of the surface density and volume density of dislocations in an SiC single crystal described in Patent Literature 1 (Comparative example 2) are also shown in Table 2. From Table 2, it is obvious that the dislocation density of the crystal in Comparative example 1 reported already by the inventors is sufficiently low and moreover the dislocation density of the crystal in Example 1 shown in the present invention reduces further significantly in comparison with a commercially available wafer.

TABLE 2

|  | Surface density (pieces/cm$^2$) | | | Volume density (cm/cm$^3$) | | |
| --- | --- | --- | --- | --- | --- | --- |
|  | Basal plane dislocation | Edge dislocation | Total | Basal plane dislocation | Edge dislocation | Total |
| Comparative example 2 | 500 | 19500 | 20000 | (Inconvertible) | 19500 | >19500 |
| Comparative example 1 |  |  |  | 2505 | 1228 | 3773 |
| Example 1 |  |  |  | 47.6 | 616.8 | 664.4 |

Comparative example 2: JP-A No. 2010-089983 (Patent Literature 1)
Comparative example 1: Journal of Crystal Growth, 304(2007)57-63 (Non-patent Literature 3)

Example 2

1. Manufacturing of Specimen

A wafer of 500 μm in thickness was obtained by cutting a 4H—SiC single crystal obtained in Example 1 nearly parallel to a {0001} plane (offset angle: 8°) and applying flattening treatment and damage layer removing treatment to the surface. The damage layer was removed by CMP treatment.

[2. Test Method]

[2.1. X-ray Topography Measurement]

With regard to the three planes of a (−1010) plane, a (1-100) plane, and a (01-10) plane, those being crystallo-

TABLE 1

|  | Comparative example 1 | | | Example 1 | | |
| --- | --- | --- | --- | --- | --- | --- |
| Cut off plane | {0001} plane 8° offset | {11-20} plane 15° offset | | {0001} plane 8° offset | {11-20} plane onset | |
| Measurement method | Transmission X-ray topography | | | Transmission X-ray topography | | |
| g vector | 1-100 | 22-40 | 0004 | 1-100 | 11-20 | 0004 |
| Measurement area | 10 mm square | 0.997 × 1.246 mm | 2.58 × 3.26 mm | 10 mm square | 10 mm square | 10 mm square |
| Specimen thickness | 400 μm | 400 μm | 400 μm | 500 μm | 500 μm | 500 μm |
| Main detected dislocation | Basal plane (distortion in c-plane) | Threading edge + Basal plane (distortion in c-plane) | Threading screw + Basal plaen (distortion in c-axis direction) | Basal plane (distortion in c-plane) | Threading edge | Threading screw + Basal plane (distortion in c-axis direction) |
| Average length and number of dislocations in image | 668 mm | Threading edge: 5.98 mm Basal plane (distortion in c-plane): | Threading scew: 23.34 mm Basal plane (distortion in c-axis direction): 1.66 mm | (a) 23.8 mm (b) 46.5 mm (c) 318 mm (d) 739 mm | Threading edge: (a) 308.4 mm (b) 275 mm (c) 379 mm (d) 624 mm | Thrreading scew: (a) 0 mm Basal plane (distortion in c-axis direction): (a) 0 mm |
| Dislocation total length per cm$^3$ | 2505 cm/cm$^3$ | 1228 cm/cm$^3$ | 743 cm/cm$^3$ | (a) 47.6 cm/cm$^3$ (b) 141 cm/cm$^3$ (c) 963 cm/cm$^3$ (d) 2241 cm/cm$^3$ | (a) 617 cm/cm$^3$ (b) 550 cm/cm$^3$ (c) 758 cm/cm$^3$ (d) 1248 cm/cm$^3$ | (a) 0 cm/cm$^3$ |
| Density of dislocations each of which has Burgers vector in direction parallel to <11-20> direction |  | 3733 cm/cm$^3$ | | (a) 664 cm/cm$^3$ (b) 691 cm/cm$^3$ (c) 1721 cm/cm$^3$ (d) 3489 cm/cm$^3$ | | |

(a) to (d) represent different compartments.

graphically equivalent and having diffraction plane orientations forming angles of 60° with each other, {1-100} plane diffraction images were measured and X-ray topography images were obtained on photosensitive films. In the three obtained X-ray topography images, basal plane dislocation images rectilinearly extending in the {0001} planes were observed.

The measurement conditions of the X-ray topography are as follows:

X-ray tube: Mo target,
Voltage: 60 kV,
Current: 300 mA,
Diffraction condition: {1-100} plane diffraction (2θ: 15.318°),
Width of second slit: 2 mm,
Scanning speed: 2 mm/sec,
Scanning frequency: 300 times.

[2.2. Preprocessing of Image]

The X-ray topography images were taken in with a scanner and thereby digitized. The scanning condition was a gray scale and the resolution of about 1,000 pixels/cm. A square measurement region where the length L of each side is 10 mm was taken out from the vicinity of the center of each of the digitized X-ray topography images and the gray level was corrected so that a basal plane dislocation site may be darkest and a non-dislocation site may be lightest. The resolution of an image was dropped so that the number of the pixels on one side of the image may be 512 pixels and the image was transformed into an image file of a bitmap format.

[2.3. Orientation Measurement by Fourier Transformation]

The preprocessed three digital images were processed by Fiber Orientation Analysis Ver.8.13 as Fourier transformation software and a power spectrum and an $A_{ave.}(\theta)$ were obtained for each of the three digital images. Further, the $A_{ave.}(\theta)$'s obtained for the three images were integrated. Further, by using the integrated value $A'_{ave.}(\theta)$, $A'_{ave.}(\theta_i)$/B.G.$(\theta_i)$ ratios at three $\theta_i$'s (i=1 to 3) corresponding to the <1-100> direction in a reciprocal space were obtained.

[3. Result]

In the case of Example 2, the $A'_{ave.}(\theta_1)$/B.G.$(\theta_i)$'s in the three $\theta_i$'s corresponding to the <1-100> direction in the reciprocal space were 1.49, 1.06, and 1.83 respectively and this case did not conform to the orientation region stated earlier.

Although the embodiments according to the present invention have heretofore been explained in detail, the present invention is not limited at all by the embodiments and can be modified variously within the range not deviating from the tenor of the present invention.

An SiC single crystal according to the present invention can be used as a semiconductor material of an ultralow power-loss power device.

What is claimed is:

1. A silicon carbide (SiC) single crystal comprising a low dislocation density region (A) where the volume density of dislocations each of which has a Burgers vector in a {0001} in-plane direction is not more than 3,700 cm/cm3.

2. The SiC single crystal according to claim 1, wherein the dislocation having a Burgers vector in a {0001} in-plane direction is a dislocation having a Burgers vector in a direction parallel to a <11-20> direction.

3. The SiC single crystal according to claim 1, wherein the volume density of dislocations each of which has a Burgers vector in a {0001} in-plane direction is a value measured by an X-ray topography method.

4. The SiC single crystal according to claim 2, wherein the low dislocation density region (A) is a region where a volume density of threading edge dislocations is not more than 1,200 cm/cm3.

5. The SiC single crystal according to claim 4, wherein the volume density of threading edge dislocations is a value measured through the procedures of (a) or (b) below:

(a)
- (1) a wafer B is cut out nearly vertically to a {0001} plane and nearly parallel to a {1-100} plane from the SiC single crystal, and the wafer B can secure a measurement region having a thickness of not less than 100 μm to not more than 1,000 μm and a volume of not less than 0.03 cm3,
- (2) X-ray topography measurement by transmission arrangement in {11-20} plane diffraction is applied to the wafer B, and
- (3) a total length of the threading edge dislocations included in a {11-20} plane diffraction image of the wafer B is obtained, and the volume density is computed from the total length; or (b)
- (1) X-ray topography measurement by reflection arrangement in {11-28} plane diffraction is applied to a surface nearly parallel to a {0001 } plane of the SiC single crystal, and
- (2) the volume density is computed by multiplying the number of threading edge dislocation images (small white dots) included in {11-28} plane diffraction of the wafer B per cm2 by 1 cm.

6. The SiC single crystal according to claim 2, wherein the low dislocation density region (A) is a region where a volume density of basal plane dislocations each of which has a Burgers vector in a direction parallel to a <11-20> direction is not more than 2,500 cm/cm3.

7. The SiC single crystal according to claim 6, wherein the volume density of basal plane dislocations each of which has a Burgers vector in a direction parallel to a <11-20> direction is a value measured through the following procedures:

- (1) a wafer A nearly parallel to a {0001 } plane is cut out from the SiC single crystal, and the wafer A can secure a measurement region having a thickness of not less than 100 μm to not more than 1,000 μm and a volume of not less than 0.03 cm3;
- (2) X-ray topography measurement by transmission arrangement in crystallographically-equivalent three {1-100} plane diffractions is applied to the wafer A; and
- (3) an average total length is obtained by adding the lengths of the basal plane dislocations each of which has a Burgers vector in a direction parallel to a <11-20> direction included in three {1-100} plane diffraction images of the wafer A and dividing the sum of the lengths by 2, and the volume density is computed from the average total length.

8. The SiC single crystal according to claim 2, further comprising a low dislocation density region (B) where a volume density of dislocations each of which has a Burgers vector in a direction parallel to a <0001> direction is not more than 740 cm/cm3.

9. The SiC single crystal according to claim 8, wherein the volume density of dislocations each of which has a Burgers vector in a direction parallel to a <0001> direction is a value measured through the following procedures:

- (1) a wafer B nearly vertical to a {0001} plane and nearly parallel to a {1-100} plane is cut out from the SiC single crystal, and the wafer B can secure a measurement region having a thickness of not less than 100 μm to not more than 1,000 μm and a volume of not less than 0.03 cm3;

(2) X-ray topography measurement by transmission arrangement in {000m} plane diffraction (here, m represents a repetition period of a-type SiC polytype) is applied to the wafer B; and (3) total lengths of threading screw dislocations and basal plane edge dislocations included in a {000m} plane diffraction image of the wafer B are obtained respectively, and the volume density is computed from the total lengths.

10. The SiC single crystal according to claim 8, wherein the low dislocation density region (B) is a region where a volume density of threading screw dislocations is not more than 690 cm/cm3.

11. The SiC single crystal according to claim 8, wherein the low dislocation density region (B) does not include dislocations each of which has a Burgers vector in a direction parallel to a <0001> direction.

12. The SiC single crystal according to claim 1, wherein the low dislocation density region (A) does not include a stacking fault.

13. The SiC single crystal according to claim 1, wherein the low dislocation density region (A) does not include an orientation region where basal plane dislocations have a high linearity and are oriented to directions parallel to crystallographically-equivalent three <11-20> directions, the "orientation region" meaning a region judged through the following procedures:

(a) a wafer nearly parallel to a {0001} plane is cut out from the SiC single crystal, (b) X-ray topography measurement by transmission arrangement is applied to the wafer, and X-ray topography images corresponding to crystallographically-equivalent three {1-100} plane diffractions are photographed, (c) each of the three X-ray topography images is transformed into a digital image obtained by quantifying the brightness of each point in the image, and each of the three digital images is comparted into a square measurement region where the length L of each side is 10±0.1 mm, (d) two-dimensional Fourier transformation treatment is applied to each of the three digital images in the three measurement regions corresponding to an identical region on the wafer, and a power spectrum (spectrum of the amplitude A of a Fourier coefficient) is obtained, (e) each of the three power spectra is converted into a polar coordinate function, and a function Aave. (θ) of angle (orientation) dependency of an average amplitude A is obtained (0°≤θ≤180°) , (f) an integrated value A'ave. (θ) of the three Aave. (θ)'s is shown in a graph (x-axis: θ, y-axis: A'ave.), and the ratio of a peak value A'ave. (θi) to a background B.G. (θi) (=A'ave.(θi)/B.G.(θi) ratio) is computed for each of three θi's (i=1 to 3) corresponding to the three <1-100> directions, and (g) when all of the three A'ave.(θi)/B.G.(θi) ratios are 1.1 or more, the region of the wafer corresponding to the three measurement regions is judged as an "orientation region".

14. An SiC wafer cut out from the SiC single crystal according to claim 1, wherein the low dislocation density region (A) accounts for not less than 50% of the wafer surface area.

15. An SiC wafer cut out from the SiC single crystal according to claim 1, wherein the SiC wafer has the low dislocation density region (A) in the center of the wafer surface.

16. An SiC wafer cut out from the SiC single crystal according to claim 1, wherein the low dislocation density region (A) accounts for the region excluding the region between the outer circumference and 1 cm inside the outer circumference of the wafer.

17. A semiconductor device manufactured by using the SiC wafer according to claim 14.

* * * * *